(12) United States Patent
Huang et al.

(10) Patent No.: US 12,148,811 B2
(45) Date of Patent: Nov. 19, 2024

(54) METHOD OF FABRICATING A SEMICONDUCTOR DEVICE HAVING CAPACITOR MATERIAL

(71) Applicant: Taiwan Semiconductor Manufacturing Co., Ltd., Hsin-Chu (TW)

(72) Inventors: Wang-Chun Huang, Hsinchu (TW); Ching-Wei Tsai, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/810,684

(22) Filed: Jul. 5, 2022

(65) Prior Publication Data

US 2022/0336622 A1 Oct. 20, 2022

Related U.S. Application Data

(62) Division of application No. 16/802,396, filed on Feb. 26, 2020, now Pat. No. 11,715,781.

(51) Int. Cl.
*H01L 29/51* (2006.01)
*H01L 21/8234* (2006.01)
(Continued)

(52) U.S. Cl.
CPC .... *H01L 29/513* (2013.01); *H01L 21/823431* (2013.01); *H01L 27/0886* (2013.01);
(Continued)

(58) Field of Classification Search
CPC .......... H01L 29/0673; H01L 29/42392; H01L 29/78696; H01L 29/66545; H01L 21/8238–823871; H01L 28/40–92
See application file for complete search history.

(56) References Cited

U.S. PATENT DOCUMENTS

| 5,341,009 A | 8/1994 | Young et al. |
| 6,365,465 B1 | 4/2002 | Chan et al. |

(Continued)

FOREIGN PATENT DOCUMENTS

| CN | 1649454 A | 8/2005 |
| CN | 105027315 A | 11/2015 |

(Continued)

*Primary Examiner* — Jesse Y Miyoshi
(74) *Attorney, Agent, or Firm* — Haynes and Boone, LLP

(57) ABSTRACT

A method includes providing first and second structures over a substrate, wherein each of the first and second structures includes source/drain (S/D) regions, a channel region between the S/D regions, a sacrificial dielectric layer, and a sacrificial gate. The method further includes partially recessing the sacrificial gate without exposing the sacrificial dielectric layer in each of the first and the second structures; forming a first patterned mask that covers the first structure; removing the sacrificial gate from the second structure; removing the first patterned mask and the sacrificial dielectric layer from the second structure; and depositing a layer of a capacitor material over the portion of the sacrificial gate in the first structure and over the channel region in the second structure.

20 Claims, 29 Drawing Sheets

(51) Int. Cl.
*H01L 27/088* (2006.01)
*H01L 29/423* (2006.01)
*H01L 29/66* (2006.01)
*H01L 29/78* (2006.01)
*H01L 29/786* (2006.01)

(52) U.S. Cl.
CPC .. *H01L 29/42392* (2013.01); *H01L 29/66545* (2013.01); *H01L 29/785* (2013.01); *H01L 29/78696* (2013.01)

(56) References Cited

U.S. PATENT DOCUMENTS

| | | | |
|---|---|---|---|
| 7,274,051 | B2 | 9/2007 | Kim et al. |
| 7,859,081 | B2 * | 12/2010 | Doyle .................... H01L 28/91 |
| | | | 257/E27.092 |
| 8,143,113 | B2 | 3/2012 | Bansaruntip et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,860,148 | B2 | 10/2014 | Hu et al. |
| 8,962,400 | B2 | 2/2015 | Tsai et al. |
| 9,093,514 | B2 | 7/2015 | Tsai et al. |
| 9,105,490 | B2 | 8/2015 | Wang et al. |
| 9,236,267 | B2 | 1/2016 | De et al. |
| 9,236,300 | B2 | 1/2016 | Liaw |
| 9,245,805 | B2 | 1/2016 | Yeh et al. |
| 9,520,482 | B1 | 12/2016 | Chang et al. |
| 9,576,814 | B2 | 2/2017 | Wu et al. |
| 9,653,480 | B1 * | 5/2017 | Cheng .................... H01L 28/82 |
| 9,893,145 | B1 * | 2/2018 | Cheng ................ H01L 27/0629 |
| 10,074,730 | B2 | 9/2018 | Bergendahl et al. |
| 2008/0237675 | A1 | 10/2008 | Doyle et al. |
| 2009/0001438 | A1 | 1/2009 | Doyle et al. |
| 2012/0138886 | A1 | 6/2012 | Kuhn et al. |
| 2014/0084387 | A1 | 3/2014 | Dewey et al. |
| 2014/0209854 | A1 | 7/2014 | Bangsaruntip et al. |
| 2014/0231891 | A1 | 8/2014 | Basker et al. |
| 2017/0110542 | A1 | 4/2017 | Lee et al. |
| 2017/0263711 | A1 | 9/2017 | Lee et al. |
| 2018/0083046 | A1 | 3/2018 | Cheng et al. |
| 2018/0166553 | A1 | 6/2018 | Lee |
| 2018/0226490 | A1 | 8/2018 | Le et al. |
| 2019/0081152 | A1 | 3/2019 | Suh |
| 2019/0312028 | A1 | 10/2019 | Park et al. |
| 2020/0027791 | A1 | 1/2020 | Loubel et al. |

FOREIGN PATENT DOCUMENTS

| | | |
|---|---|---|
| CN | 106816381 A | 6/2017 |
| CN | 106876275 A | 6/2017 |
| CN | 107464840 A | 12/2017 |
| CN | 108231664 A | 6/2018 |
| CN | 109755120 A | 5/2019 |
| KR | 20170045616 A | 4/2017 |
| KR | 20170099863 A | 9/2017 |
| TW | 201030947 A | 8/2010 |
| WO | 2019132876 A1 | 7/2019 |

* cited by examiner

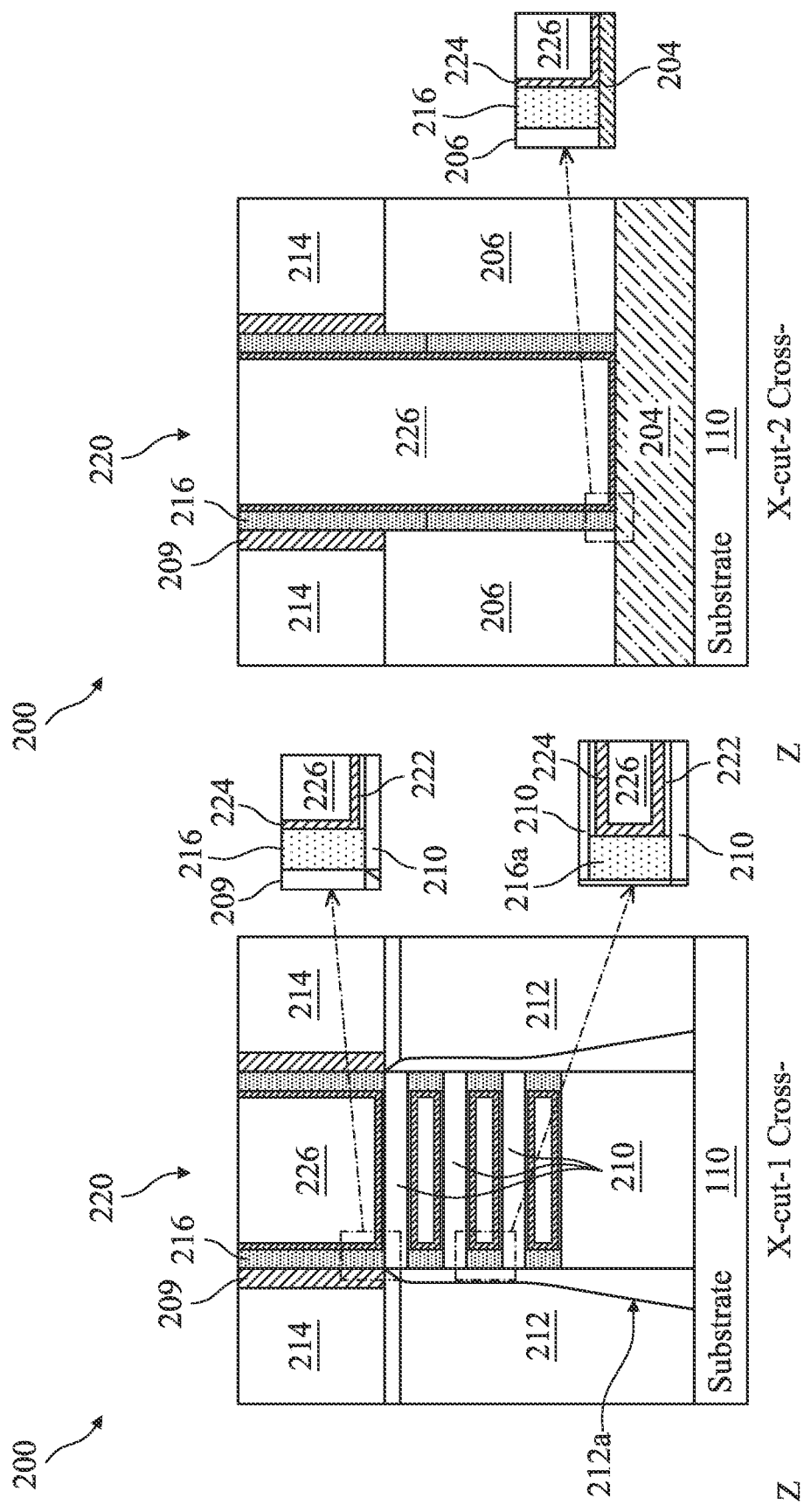

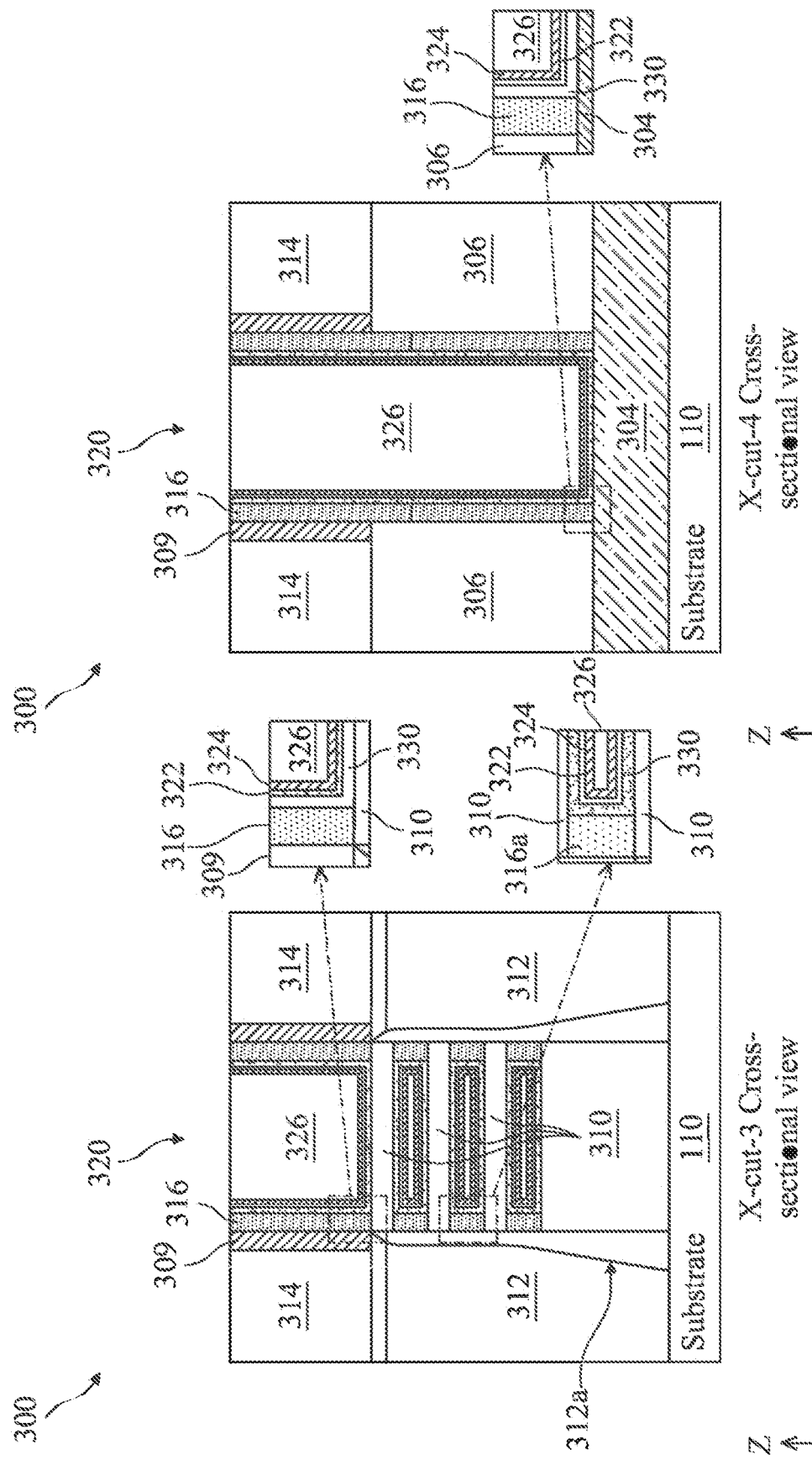
FIG. 3a  X-cut-3 Cross-sectional view
FIG. 3b  X-cut-4 Cross-sectional view

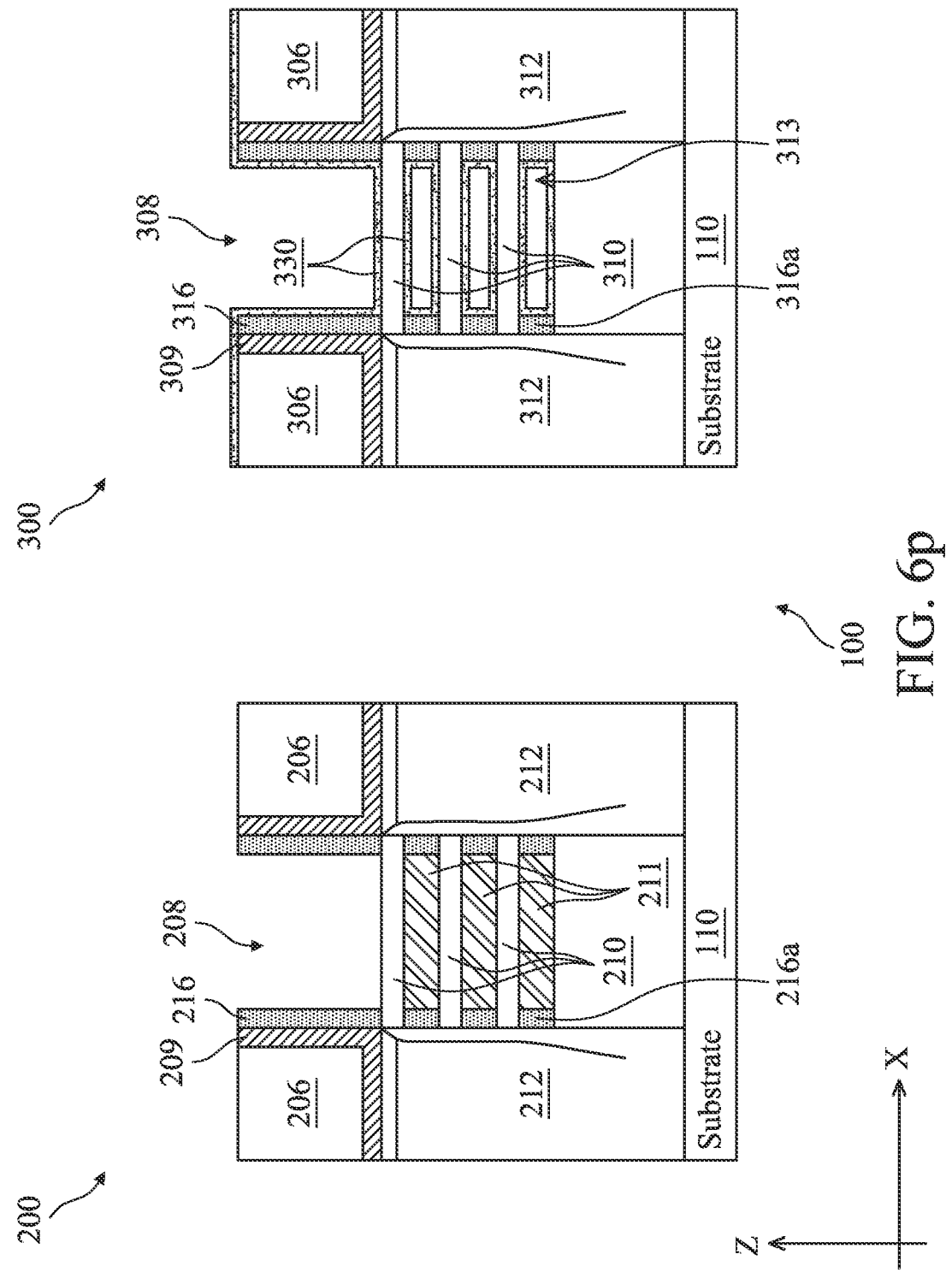

METHOD OF FABRICATING A SEMICONDUCTOR DEVICE HAVING CAPACITOR MATERIAL

PRIORITY

This is a divisional of U.S. patent application Ser. No. 16/802,396, filed Feb. 26, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, device capacitance per device foot print is decreasing as the devices are scaled-down. For designs requiring capacitors (such as analog decoupling capacitors or de-cap), this means more area need to be devoted to the capacitors to provide the same capacitance in a smaller process node than in previous generations. Thus, it is generally desirable to provide larger capacitance per device foot print in the advanced process nodes even as transistors in the same nodes are scaled-down.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2a and 2b show cross-sectional views of a portion of the logic device of FIG. 1, in accordance with an embodiment.

FIGS. 3a and 3b show cross-sectional views of a portion of the capacitor of FIG. 1, in accordance with an embodiment.

FIGS. 6a, 6b, 6c, 6d, 6e, 6f, 6g, 6h, 6i, 6j, 6k, 6l, 6m, 6n, 6o, 6p, 6q, and 6r illustrate cross-sectional views of an embodiment of the logic device and the capacitor of FIG. 1 during a fabrication process according to the method of FIGS. 5a and 5b, in accordance with some embodiment.

DETAILED DESCRIPTION

Figure 1:
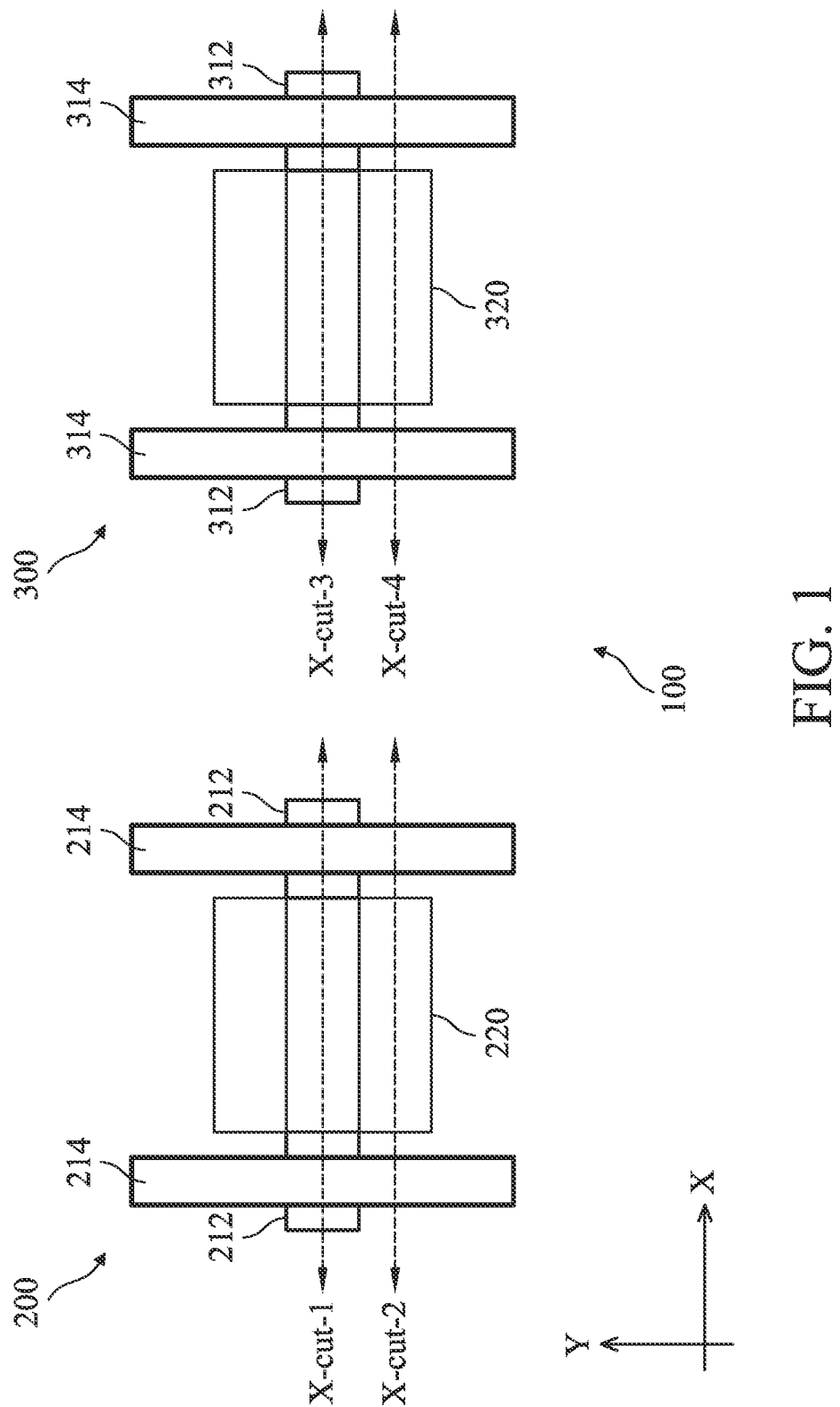
FIG. 1 is a simplified top view of a logic device and a capacitor of an integrated circuit (IC), according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating capacitors with increased capacitance per device foot print, which are fabricated at the same layer as other transistors, such as transistors used for performing logic functions (i.e., logic devices). Some embodiment of the present disclosure takes advantage of a replacement gate process. For example, after a dummy gate is removed to expose a semiconductor channel, a layer of a capacitor material (referred to as "deposited capacitor material" or DCM) is deposited directly on the semiconductor channel, followed by forming a high-k metal gate stack over the DCM layer. The DCM layer is coupled to the high-k metal gate stack to produce the desired capacitance. In fact, the source and drain, shorted together, provide a terminal of the capacitor and the metal gate electrode provides the other terminal of the capacitor. In this configuration, capacitance of the capacitor is determined by the coupling area between the DCM layer and the metal gate electrode as well as the dielectric layer between them, which may include an interfacial layer and a high-k dielectric layer. The DCM layer is deposited all over the area where the high-k metal gate stack is deposited, thus increasing the coupling area compared to capacitors that do not have the DCM layer. This and other features of the present disclosure are further discussed by referring to the accompanied figures.

FIG. 1 shows a top view of two individual devices 200 and 300 of an integrated circuit (IC) 100. The two devices 200 and 300 are formed at different regions of a substrate 110 (shown in FIGS. 2a and 3a). In the present embodiment, the two devices 200 and 300 are formed in a core area (or logic area) of the IC 100. In alternative embodiments, the two devices 200 and 300 may be formed in an input/output (or I/O) area of the IC 100, or one in a core area and another in an I/O area of the IC 100.

In the present embodiment, the device 200 is implemented as a regular transistor which may be gate-all-around (GAA) transistor or a FinFET. The device 200 includes a gate stack 220 engaging a channel region 210 of a semiconductor material (shown in FIG. 2a) and two source/drain (S/D) electrodes 212 on two sides of the gate stack 220. The device 200 further includes S/D contacts 214 disposed on and electrically connected to the S/D electrodes 212. In the present embodiment, the device 300 is implemented as a capacitor. The device 300 includes a gate stack 320 that is disposed over a channel region 310 of a semiconductor material (shown in FIG. 3a) and two S/D electrodes 312 on two sides of the gate stack 320. The device 300 further includes S/D contacts 314 disposed on and electrically connected to the S/D electrodes 312. The S/D electrodes 312 are electrically shorted together at some interconnect level to make the device 300 effectively a two-terminal capacitor. Further details of the devices 200 and 300 are shown in FIGS. 2a, 2b, 3a, and 3b.

FIGS. 2a and 2b show two cross-sectional views of the device 200 along the X-cut-1 line and X-cut-2 line in FIG. 1, respectively, which are cut along a lengthwise direction of the channel region 210. Referring to FIGS. 2a and 2b collectively, the device 200 is formed over a region of a substrate 110, which may be a semiconductor fin in some embodiment. The channel region 210 of the device 200 includes multiple semiconductor layers connecting the two S/D electrodes 212. The channel region 210 may also be referred to as semiconductor layers 210. The gate stack 220 includes an interfacial layer 222, a high-k dielectric layer 224, and a metallic gate electrode 226. The device 200 further includes a gate spacer 216 on sidewalls of the gate stack 220. Portions of the gate stack 220 are disposed vertically (along Z direction) between two adjacent semiconductor layers 210. An inner spacer 216a is disposed laterally (along X direction) between those portions of the gate stack 220 and the S/D electrodes 212. The gate spacer 216 and the inner spacer 216a may be formed at different process steps and may include same or different materials. The device 200 further includes a contact etch stop (CES) layer 209 over the S/D electrodes 212 and over the sidewalls of the gate spacer 216. The S/D contacts 214 are electrically connected to the S/D electrodes 212. The device 200 further includes an isolation structure 204 and an interlayer dielectric (ILD) layer 206 over the substrate 110. The gate stack 220, the gate spacer 216, and the ILD layer 206 are disposed over the isolation structure 204. Further, the ILD layer 206 is disposed over the sidewalls of the gate spacer 216, and the CES layer 209 is disposed over the ILD layer 206.

FIGS. 3a and 3b show two cross-sectional views of the device 300 along the X-cut-3 line and X-cut-4 line in FIG. 1, respectively, which are cut along a lengthwise direction of the channel region 310. The structure of the device 300 is substantially similar to that of the device 200. The device 300 is formed over another region of the substrate 110, which may be a semiconductor fin in some embodiment. The channel region 310 of the device 300 includes multiple semiconductor layers connecting the two S/D electrodes 312. The channel region 310 may also be referred to as semiconductor layers 310. The gate stack 320 includes an interfacial layer 322, a high-k dielectric layer 324, and a metallic gate electrode 326. The device 300 further includes a gate spacer 316 on sidewalls of the gate stack 320. Portions of the gate stack 320 are disposed vertically (along Z direction) between the semiconductor layers 310. An inner spacer 316a is disposed laterally (along X direction) between those portions of the gate stack 320 and the S/D electrodes 312. The gate spacer 316 and the inner spacer 316a may be formed at different process steps and may include same or different materials. The device 300 further includes a contact etch stop (CES) layer 309 over the S/D electrodes 312 and over the sidewalls of the gate spacer 316. The S/D contacts 314 are electrically connected to the S/D electrodes 312. The device 300 further includes an isolation structure 304 and an interlayer dielectric (ILD) layer 306 over the substrate 110. The gate stack 320, the gate spacer 316, and the ILD layer 306 are disposed over the isolation structure 304. Further, the ILD layer 306 is disposed over the sidewalls of the gate spacer 316, and the CES layer 309 is disposed over the ILD layer 306.

The substrate 110 is a silicon substrate in the present embodiment. Alternatively, the substrate 110 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The isolation structures 204 and 304 may be different portions of the same isolation structure that may comprise silicon oxide, silicon nitride, silicon oxynitride, fluoride-doped silicate glass (FSG), a low-k dielectric material, and/or other suitable insulating material. The isolation structures 204 and 304 may be shallow trench isolation (STI) features. Other isolation structure such as field oxide, LOCal Oxidation of Silicon (LOCOS), and/or other suitable structures are possible. Each of the isolation structure s 204 and 304 may include a multi-layer structure, for example, having a non-conformal oxide layer over one or more thermal oxide liner layers.

The ILD layers 206 and 306 may be different portions of the same ILD layer that may include a dielectric material such as silicon oxide, silicon nitride, silicon oxynitride, TEOS formed oxide, phosphosilicate glass (PSG), low-k dielectric material, other suitable dielectric material, or combinations thereof. In some embodiments, the ILD layers 206 and 306 are formed by a flowable CVD (FCVD) process that includes, for example, depositing a flowable material (such as a liquid compound) over the other structures of the devices 200 and 300 and converting the flowable material to a solid material by a suitable technique, such as thermal annealing and/or ultraviolet radiation treating. The ILD layers 206 and 306 can include a multilayer structure having multiple dielectric materials.

The semiconductor layers 210 and 310 may include same semiconductor material, different semiconductor materials, or same semiconductor material but with different dopants. For example, each of the semiconductor layers 210 and 310 may include single crystalline silicon. Alternatively, each of the semiconductor layers 210 and 310 may comprise germanium, silicon germanium, or another suitable semiconductor material(s). The semiconductor layers 210 and 310 may be formed using the same process, which is briefly described below using the semiconductor layers 310 as example. Initially, the semiconductor layers 310 are formed as part of a semiconductor layer stack that includes the semiconductor layers 310 and other semiconductor layers of a different material. The semiconductor layer stack is patterned into a shape of a fin protruding above the substrate 110 using one or more photolithography processes, including double-patterning or multi-patterning processes. During a gate replacement process to form the gate stacks 320, the semiconductor layer stack is selectively etched to remove the other semiconductor layers, leaving the semiconductor layers 310 suspended over the substrate 110.

The S/D electrodes 212 and 312 include epitaxially grown semiconductor material(s) with proper n-type or p-type dopants. For example, each of the S/D electrodes 212 and 312 may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). Alternatively, each of the S/D electrodes 212 and 312 may include silicon germanium or germanium and may be doped with boron, other p-type dopant, or combinations thereof (for example, forming Si:Ge:B epitaxial source/drain features). Further, the S/D electrodes 212 and 312 may include same semiconductor material, different semiconductor materials, or same semiconductor material but with different dopants. The S/D electrodes 212 and 312 may be formed by etching trenches on both sides of the respective channel region, and epitaxially growing semiconductor material(s) in the trenches using CVD deposition techniques (for example, vapor phase epitaxy), molecular beam epitaxy, other suitable epitaxial growth processes, or combinations thereof. FIGS. 2a and 3a further show a phase boundary 212a and 312a in the S/D electrodes 212 and 312, respectively, that are formed due to epitaxy from different orientation. In some embodiments, such phase boundary does not appear in the S/D electrodes 212 and 312. In other words, the S/D electrodes 212 and 312 may be grown as a single-phase epitaxy. In some embodiments, the S/D electrodes 212 and 312 may comprise amorphous semiconductor material(s).

The interfacial layers 222 and 322 include a dielectric material, such as $SiO_2$, HfSiO, SiON, other silicon-comprising dielectric material, other suitable dielectric material, or combinations thereof. The interfacial layers 222 and 322 may be formed by any of the processes described herein, such as thermal oxidation, chemical oxidation, ALD, CVD, other suitable process, or combinations thereof. In some embodiments, each of the interfacial layers 222 and 322 has a thickness of about 0.5 nm to about 3 nm. Further, the interfacial layers 222 and 322 may be different portions of the same dielectric layer.

The high-k dielectric layers 224 and 324 include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The high-k dielectric layers 224 and 324 may be formed by any of the processes described herein, such as ALD, CVD, PVD, oxidation-based deposition process, other suitable process, or combinations thereof. In some embodiments, each of the high-k dielectric layers 224 and 324 has a thickness of about 1 nm to about 2 nm. Further, the high-k dielectric layers 224 and 324 may be different portions of the same dielectric layer.

The metallic gate electrodes 226 and 326 may include a work function metal layer and a bulk metal layer. The work function metal layer can be an n-type work function metal or a p-type work function metal. P-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. The work function metal layer may be formed using a suitable deposition process, such as CVD, PVD, HDPCVD, MOCVD, RPCVD, PECVD, LPCVD, ALCVD, APCVD, plating, other deposition process, or combinations thereof. The bulk metal layer includes a suitable conductive material, such as Co, Al, W, and/or Cu. The bulk metal layer may additionally or collectively include other metals, metal oxides, metal nitrides, other suitable materials, or combinations thereof. Further, the metallic gate electrodes 226 and 326 may be different portions of the same metallic layer(s).

The spacers 216, 216a, 316, and 316a may be formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)).

The CES layers 209 and 309 may be different portions of the same CES layer that includes a material different than the ILD layers 206 and 306. For example, where the ILD layers 206 and 306 include a low-k dielectric material, the CES layers 209 and 309 include silicon and nitrogen, such as silicon nitride or silicon oxynitride.

The S/D contacts 214 and 314 include a conductive material, such as metal. Suitable metals for the S/D contacts 214 and 314 include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof.

Turning to FIG. 3a, the device 300 further includes a DCM layer 330. The DCM layer 330 includes a material that is capable of acting as a terminal in a capacitor. For example, the DCM layer 330 includes a conductive material in some embodiments. In some other embodiments, the DCM layer 330 includes a semiconductor material, such as the same semiconductor material as in the substrate 110. The DCM layer 330 is deposited between the interfacial layer 322 and the semiconductor layer 310, the gate spacer 316, and the inner spacer 316a. Particularly, the DCM layer 330 fully separates the interfacial layer 322 from the semiconductor layer 310 and the spacers 316 and 316a. In embodiments where the interfacial layer 322 is omitted, the DCM layer 330 is deposited between the high-k dielectric layer 324 and the semiconductor layer 310 and the spacers 316 and 316a, and fully separates the high-k dielectric layer 324 from the semiconductor layer 310 and the spacers 316 and 316a. As shown in FIG. 3b, the DCM layer 330 is deposited between the interfacial layer 322 and the isolation structure 304 and the gate spacer 316, and fully separates the interfacial layer 322 from the isolation structure 304 and the gate spacer 316. In embodiments where the interfacial layer 322 is omitted, the DCM layer 330 is deposited between the high-k dielectric layer 324 and the isolation structure 304 and the spacer 316, and fully separates the high-k dielectric layer 324 from the isolation structure 304 and the spacer 316. The DCM layer 330 is coupled to the metallic gate electrode 326 to form a capacitor. The DCM layer 330 and the S/D electrodes 312 collectively function as an electrode of the capacitor and the metallic gate electrode 326 functions as another electrode of the capacitor. The DCM layer 330 fully surrounds the metallic gate electrode 326, thereby increasing the coupling area and the coupling capacitance compared to capacitor designs where the DCM layer 330 is not included. For example, in those capacitor designs, part of the interfacial layer 322 is deposited directly in contact with the inner spacer 316a, thus the area immediately adjacent to the inner spacer 316a is not fully utilized for capacitance. In contrast, the present embodiment fully utilizes those areas for capacitance increase.

In an embodiment, the DCM layer 330 includes a layer of doped amorphous silicon. Alternatively, the DCM layer 330 may include silicon, silicon germanium, polysilicon, a metal, a metal silicide, or a 2-dimensional (2D) material. For example, the metal may be titanium, titanium nitride, tantalum, tantalum nitride, tungsten, other suitable metals, or combinations thereof. For example, the metal silicide may include nickel silicide, cobalt silicide, tungsten silicide, tantalum silicide, titanium silicide, platinum silicide, erbium silicide, palladium silicide, or combinations thereof. For example, the 2D material may be graphene or $MoS_2$. In some embodiments, the DCM layer 330 includes the same semiconductor material as in the substrate 110. When the DCM layer 330 is a layer of silicon or silicon germanium or other semiconductor materials, the DCM layer 330 may be doped or undoped. By selecting a proper material for the DCM layer 330 and applying a proper doping in the channel region 310, a suitable threshold voltage ($V_t$) and a flexible C-V characteristic of the capacitor 300 can be achieved.

Figure 4B:
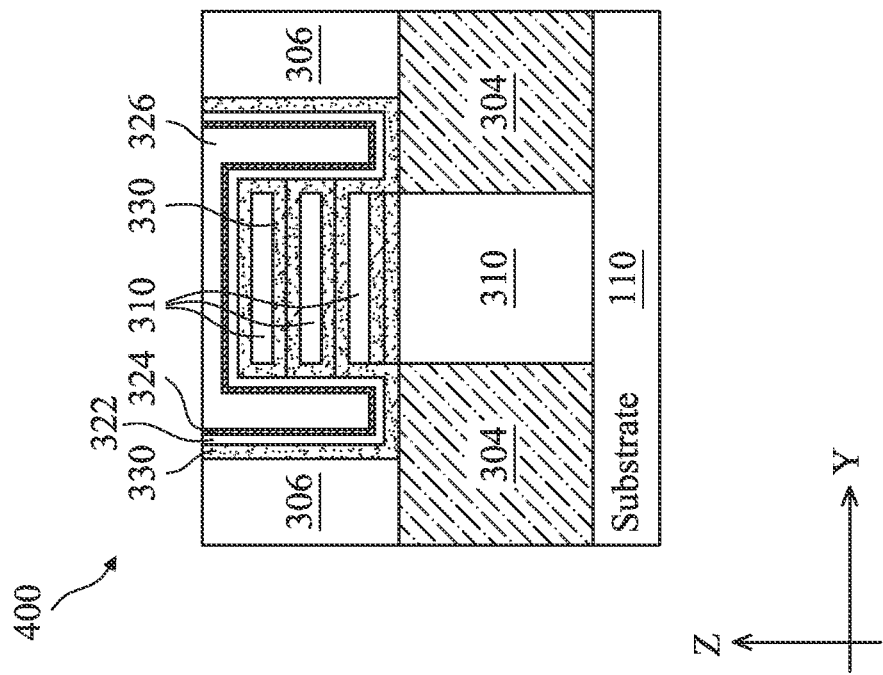
FIGS. 4b, 4c, and 4d show cross-sectional views of a portion of the capacitor of FIG. 4a, in accordance with an embodiment.
Figure 4A:
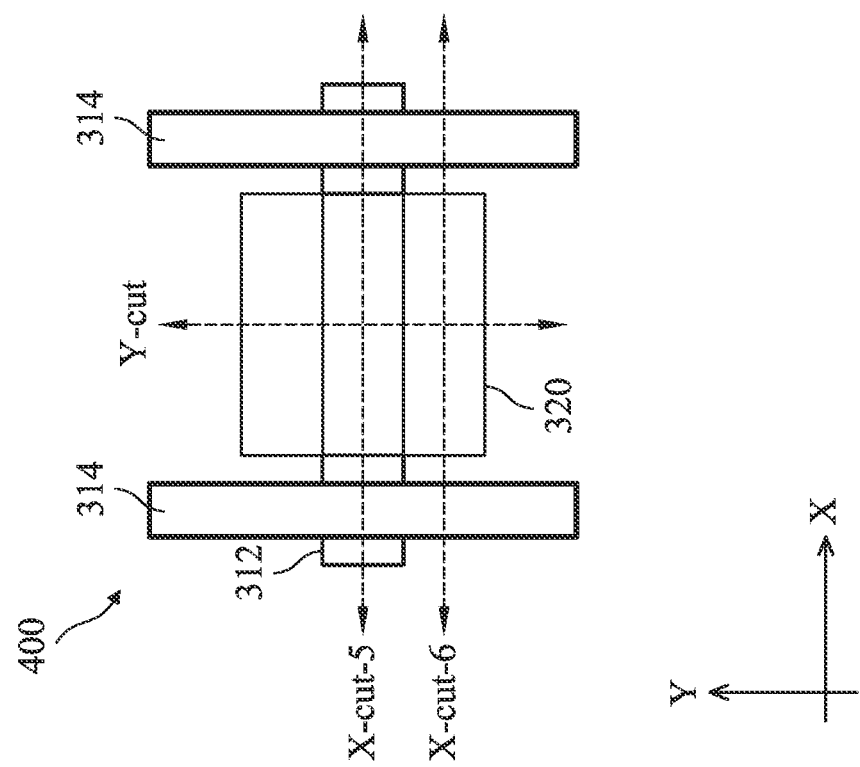
FIG. 4a is a simplified top view of another capacitor, according to various aspects of the present disclosure.
Figure 4D:
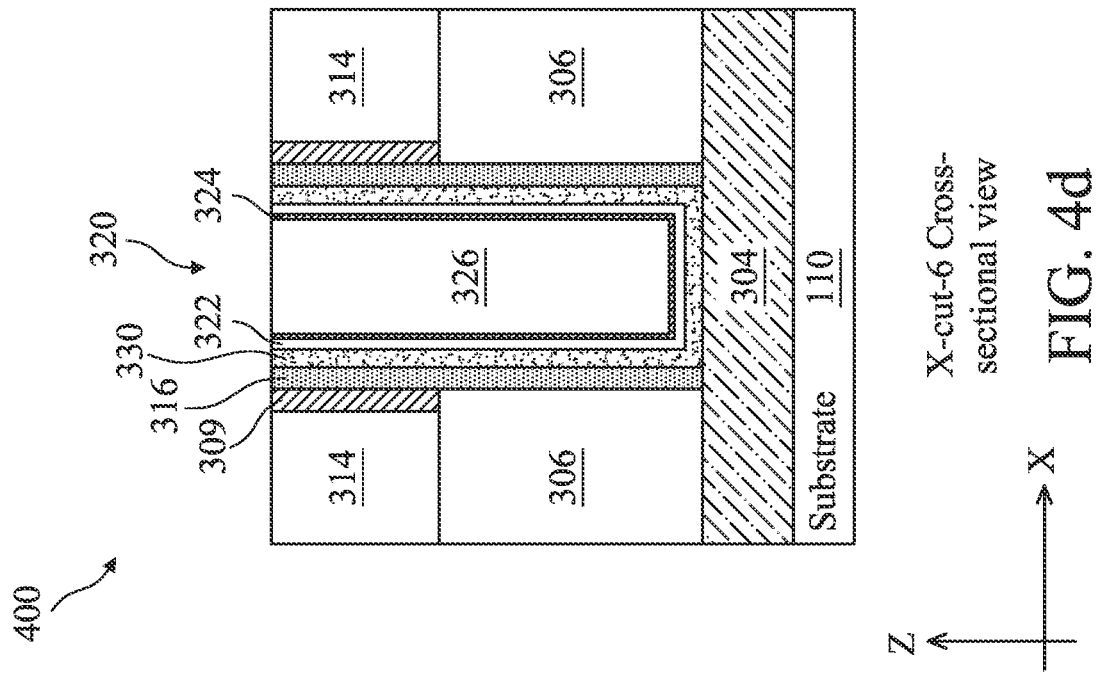
Figure 4C:
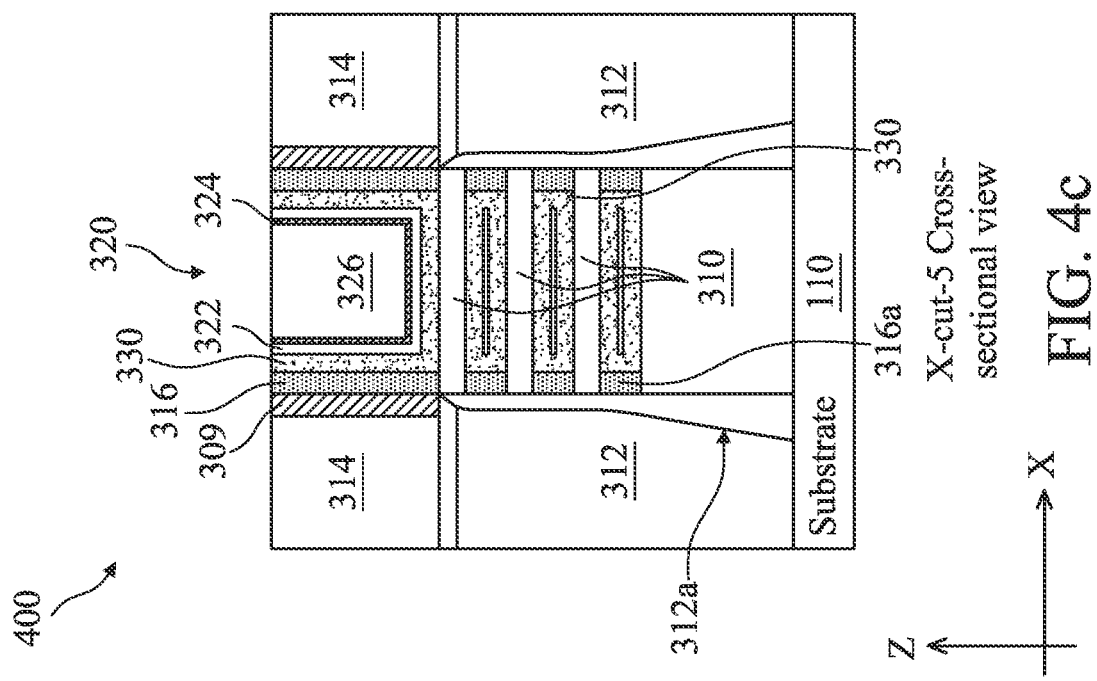

FIGS. 4a, 4b, 4c, and 4d show another device 400 according to the present disclosure. FIG. 4a shows a top view of the device 400, while FIGS. 4b, 4c, and 4d show cross-sectional views of the device 400 along the Y-cut, X-cut-5, and X-cut-6 of FIG. 4a, respectively. The structure of the device 400 is similar to that of the device 300. For the purpose of simplicity, like features between the devices 300 and 400 are labeled with the same reference numerals. The device 400 is formed over another region of the substrate 110, which may be a semiconductor fin in some embodiment. FIGS. 4b and 4c illustrate a main difference between the device 400 and the device 300. In the device 400, the DCM layer 330 fully fills space between adjacent semiconductor layers 310 vertically (along the Z direction) and between portions of the inner spacer 316a horizontally (along the X direction). In an embodiment, the device 400 may function as a high-voltage decoupling capacitor, for example, for I/O decoupling.

Figure 4E:
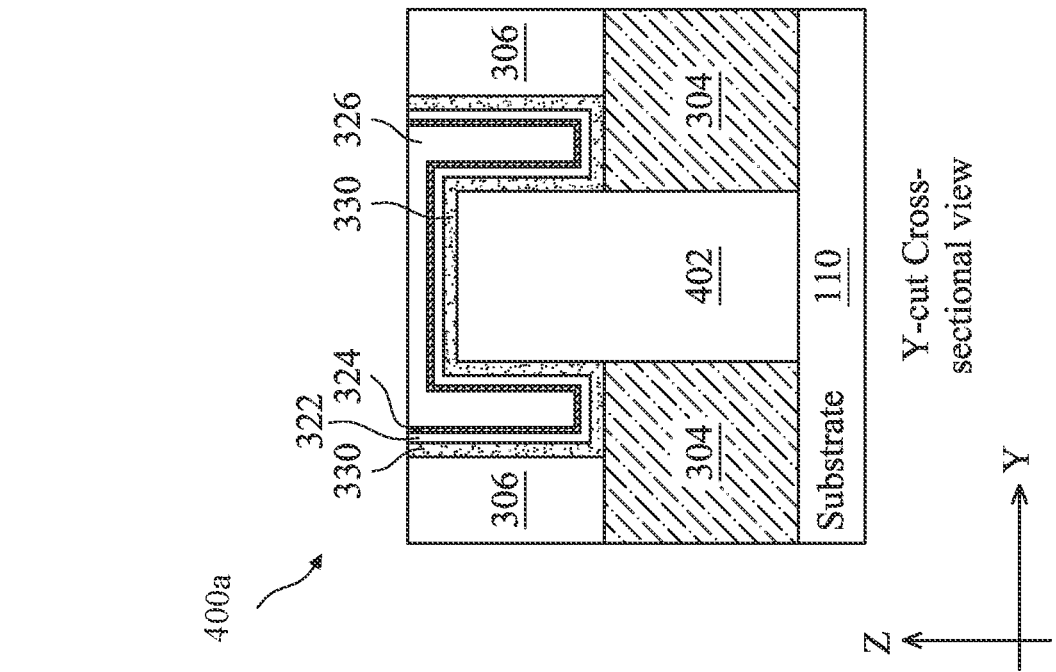
FIGS. 4e and 4f show cross-sectional views of a portion of the capacitor of FIG. 4a, in accordance with another embodiment.
Figure 4F:
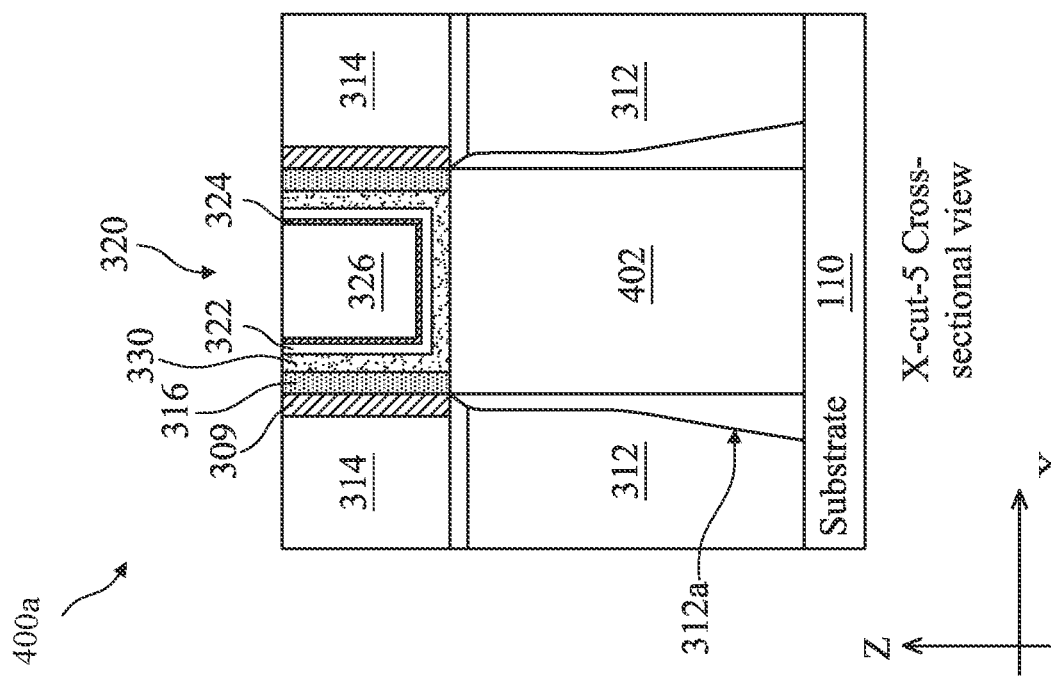

FIGS. 4e and 4f show another device 400a according to the present disclosure. The top view of the device 400a is the same as that of the device 400 (FIG. 4a). FIGS. 4e and 4f show cross-sectional views of the device 400a along the X-cut-5 and X-cut-6 of FIG. 4a, respectively. The structure of the device 400a is similar to that of the device 300. For the purpose of simplicity, like features between the devices 300 and 400a are labeled with the same reference numerals. The device 400a is formed over another region of the substrate 110, which is a semiconductor fin in this embodiment. As shown in FIGS. 4e and 4f, the channel region of the device 400a is a semiconductor fin 402 instead of a stack of semiconductors layers 310 as in the device 300. The DCM layer 330 is deposited over the top surface and the sidewall surfaces of the fin 402 and fully separates these fin surfaces from the gate stack 320.

Figure 5A:
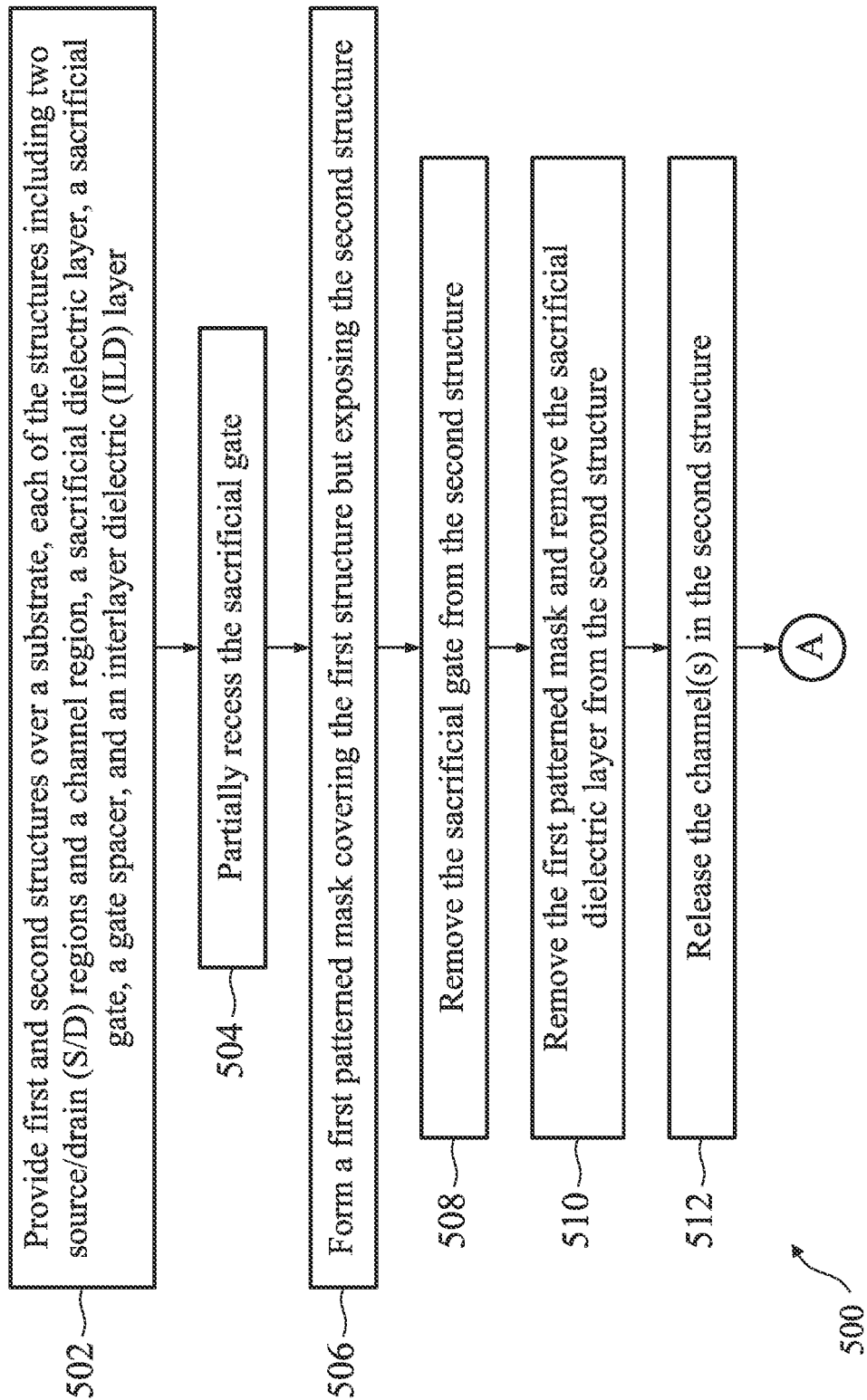
FIGS. 5a and 5b show a flow chart of a method for forming the structures shown in FIGS. 1-4f, according to aspects of the present disclosure.
Figure 5B:
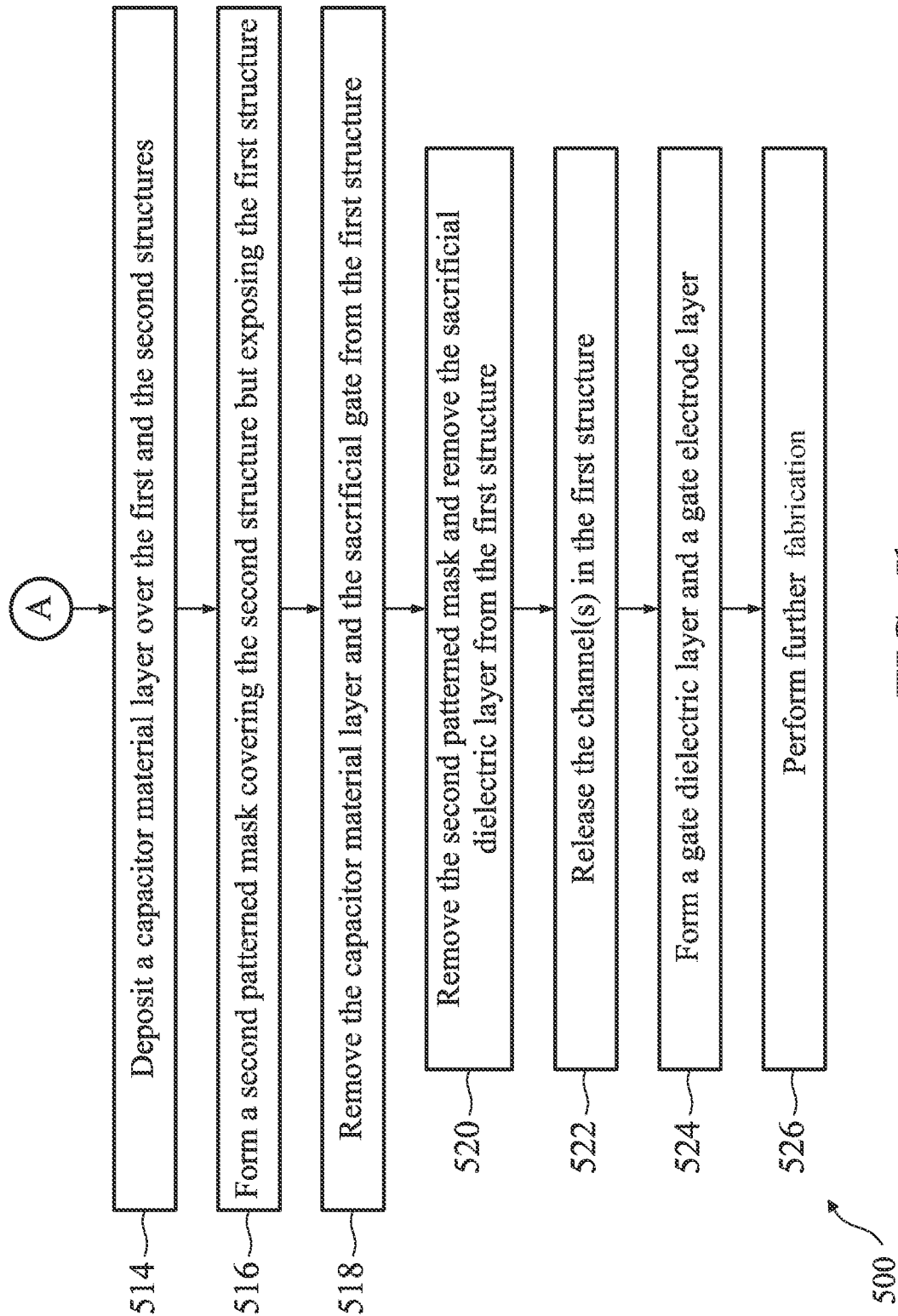
Figure 5C:
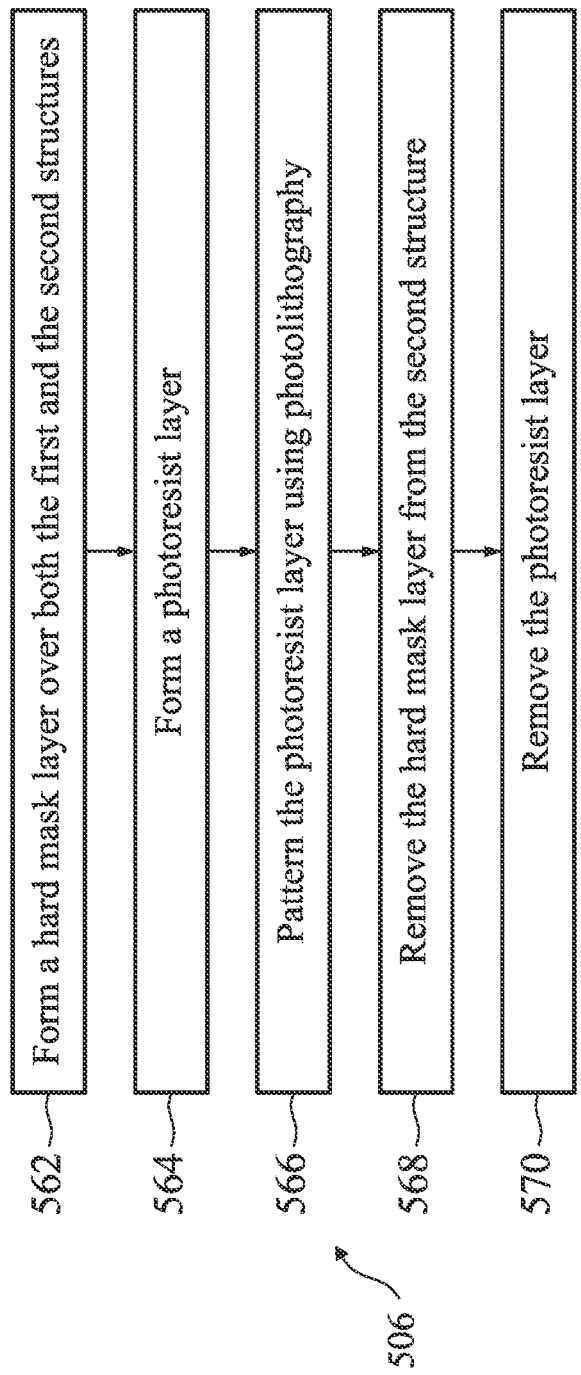
FIGS. 5c and 5d show flow charts of implementing certain steps in the method of FIGS. 5a and 5b.
Figure 5D:
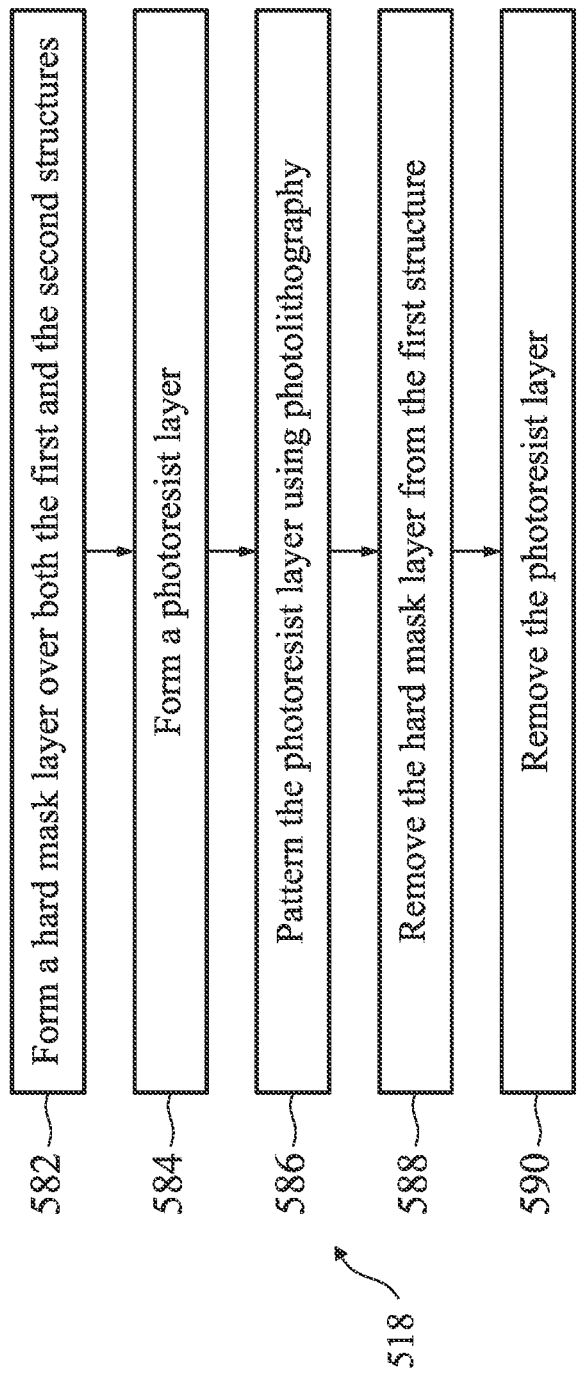

FIGS. 5a and 5b illustrate a flow chart of a method 500 for forming a semiconductor device, such as the integrated circuit 100 having the devices 200 and 300, in accordance with some embodiments. FIGS. 5c and 5d show flow charts of certain steps of the method 500 in accordance with some embodiments. The method 500 is merely an example and is not intended to limit the present disclosure beyond what is explicitly recited in the claims. Additional operations can be provided before, during, and after the method 500, and some operations described can be replaced, eliminated, or moved around for additional embodiments of the method. The method 500 is described below in conjunction with FIGS. 6a-6n, which illustrate various cross-sectional views (e.g., along the X-cut-1 and X-cut-3 lines in FIG. 1) of the semiconductor device 100 during fabrication steps according to the method 500.

Figure 6A:
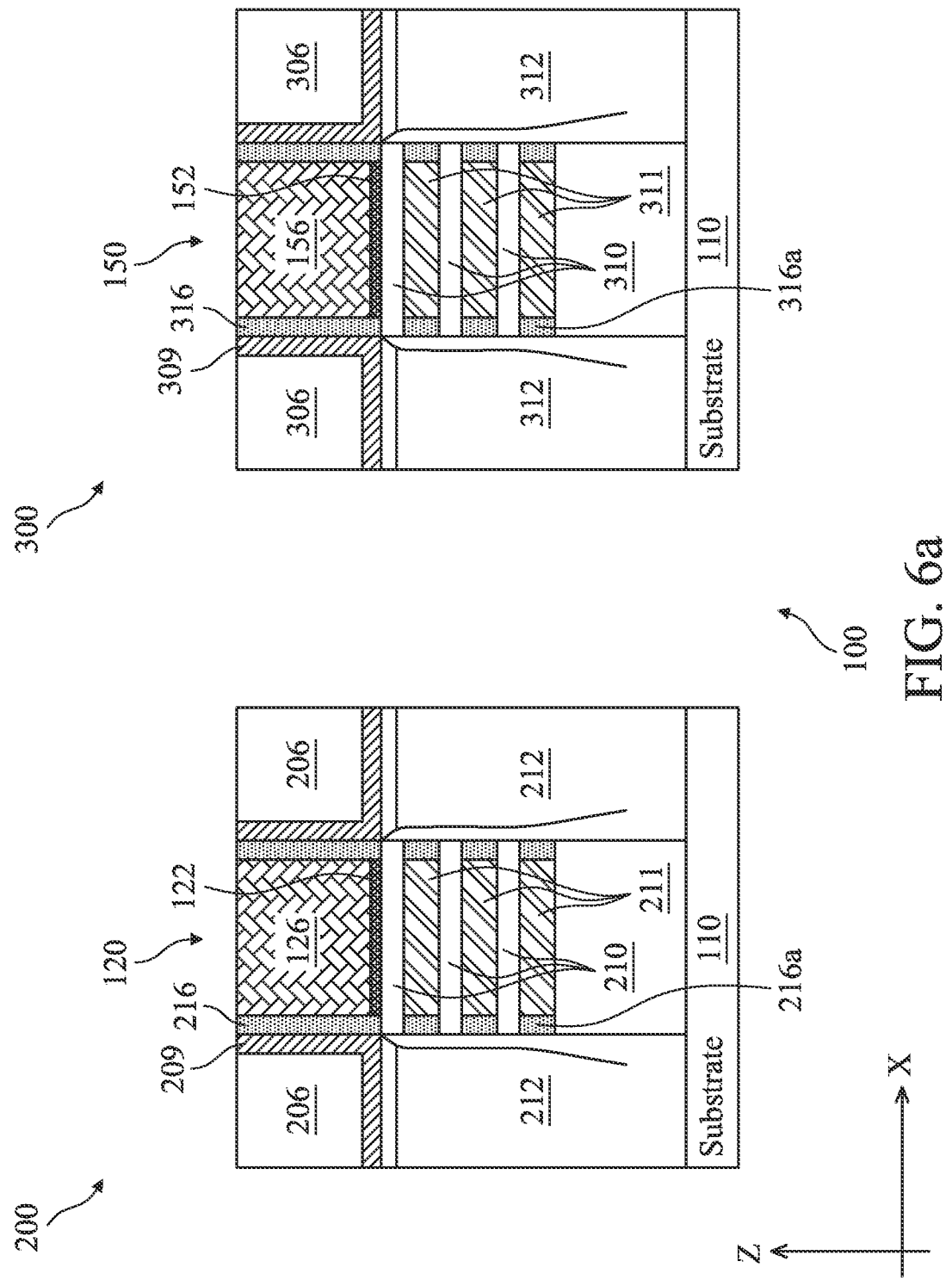

At operation 502, the method 500 (FIG. 5a) provides, or is provided with, a device structure 100, such as shown in FIG. 6a. The device structure 100 further includes a structure 200 and a structure 300 formed at different regions of a substrate 110. Referring to FIG. 6a, the structure 200 includes the S/D electrodes 212, the semiconductor layers 210, the gate spacer 216, the inner spacer 216a, the CES layer 209, and the ILD layer 206 as described with reference to FIGS. 2a and 2b. The structure 200 further includes semiconductor layers 211 that are vertically between adjacent semiconductor layers 210. The semiconductor layers 211 include a different semiconductor material than the semiconductor layers 210. In an embodiment, the semiconductor layers 210 include silicon and the semiconductor layers 211 include silicon germanium. The structure 200 further includes a sacrificial gate stack 120 (or referred to as a dummy gate stack 120). The sacrificial gate stack 120 includes a sacrificial gate dielectric layer 122 over the channel region 210 and a sacrificial gate layer 126 over the sacrificial gate dielectric layer 122.

Still referring to FIG. 6a, the structure 300 includes the S/D electrodes 312, the semiconductor layers 310, the gate spacer 316, the inner spacer 316a, the CES layer 309, and the ILD layer 306 as described with reference to FIGS. 3a and 3b. The structure 300 further includes semiconductor layers 311 that are vertically between adjacent semiconductor layers 310. The semiconductor layers 311 include a different semiconductor material than the semiconductor layers 310. In an embodiment, the semiconductor layers 310 include silicon and the semiconductor layers 311 include silicon germanium. The structure 300 further includes a sacrificial gate stack 150 (or referred to as a dummy gate stack 150). The sacrificial gate stack 150 includes a sacrificial gate dielectric layer 152 over the channel region 310 and a sacrificial gate layer 156 over the sacrificial gate dielectric layer 152.

Each of the sacrificial gate dielectric layers 122 and 152 includes a dielectric material, such as silicon dioxide, a high-k dielectric material, other suitable dielectric material, or combinations thereof. The layers 122 and 152 may be different portions of the same dielectric layer and may be formed using any deposition process or oxidation process (such as thermal oxidation). Each of the sacrificial gate layers 126 and 156 may include polysilicon or other suitable materials. The sacrificial gate stacks 120 and 150 may include other layers not shown in FIG. 6a.

Figure 6B:
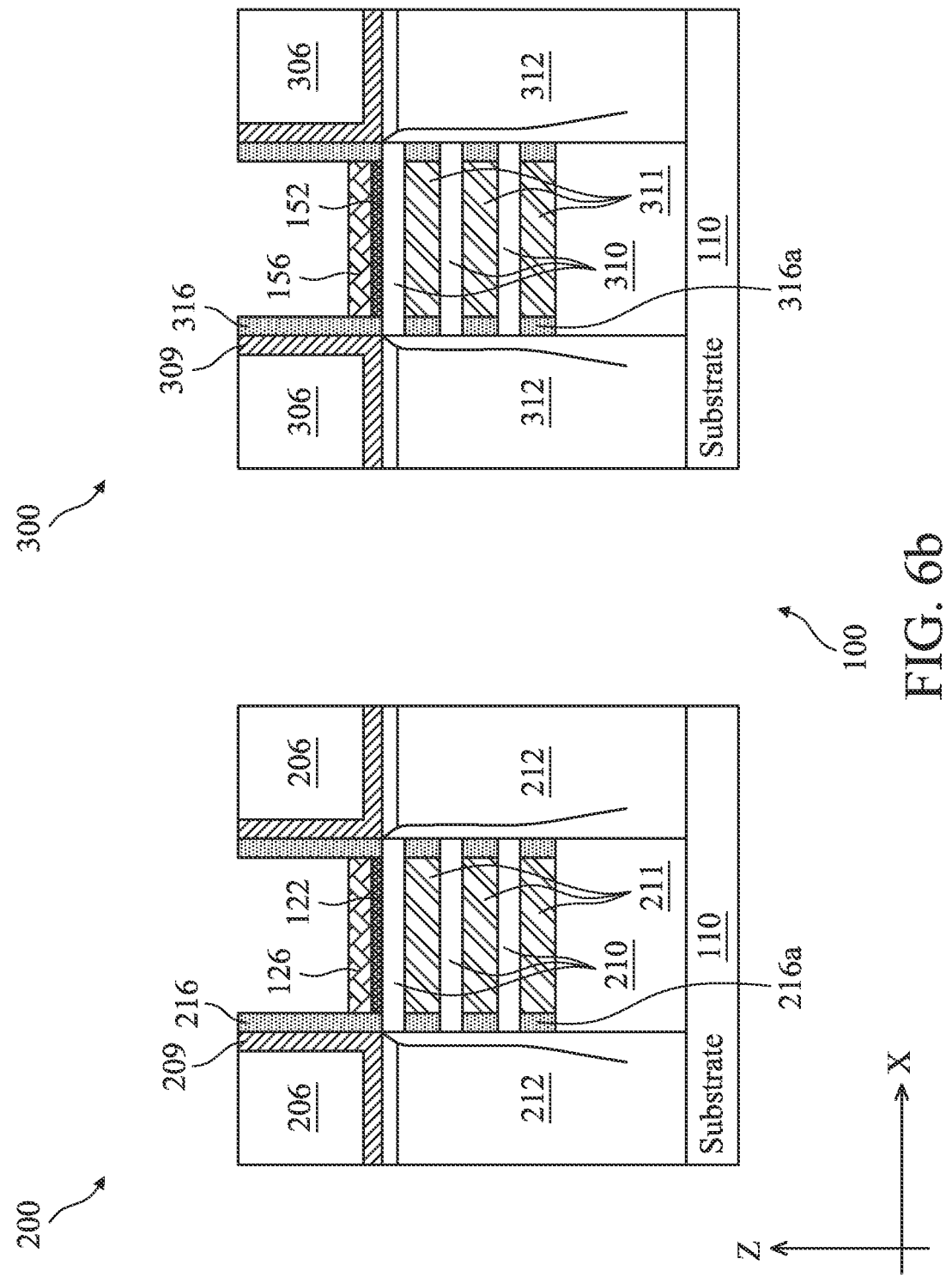
Figure 6C:
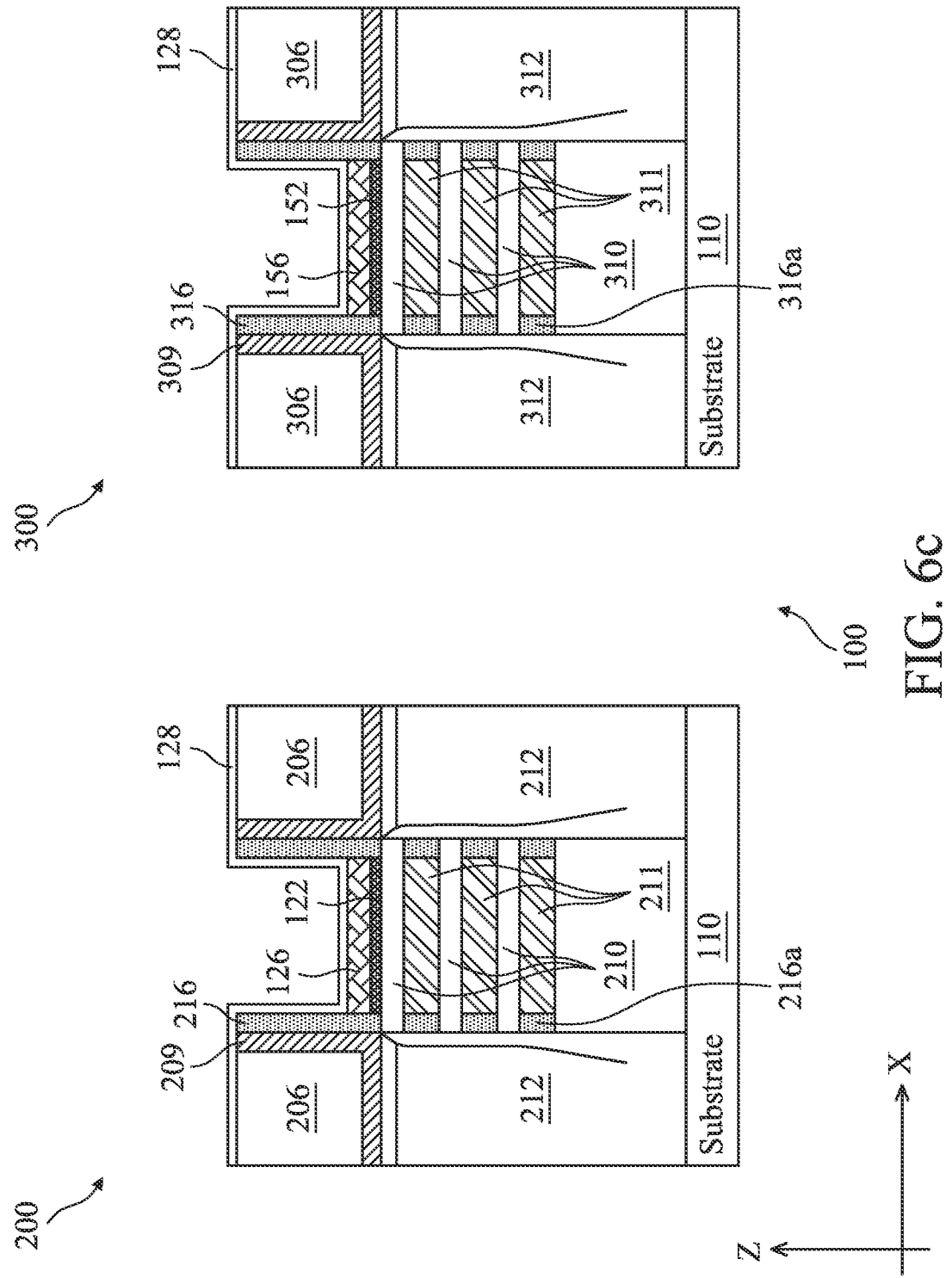
Figure 6D:
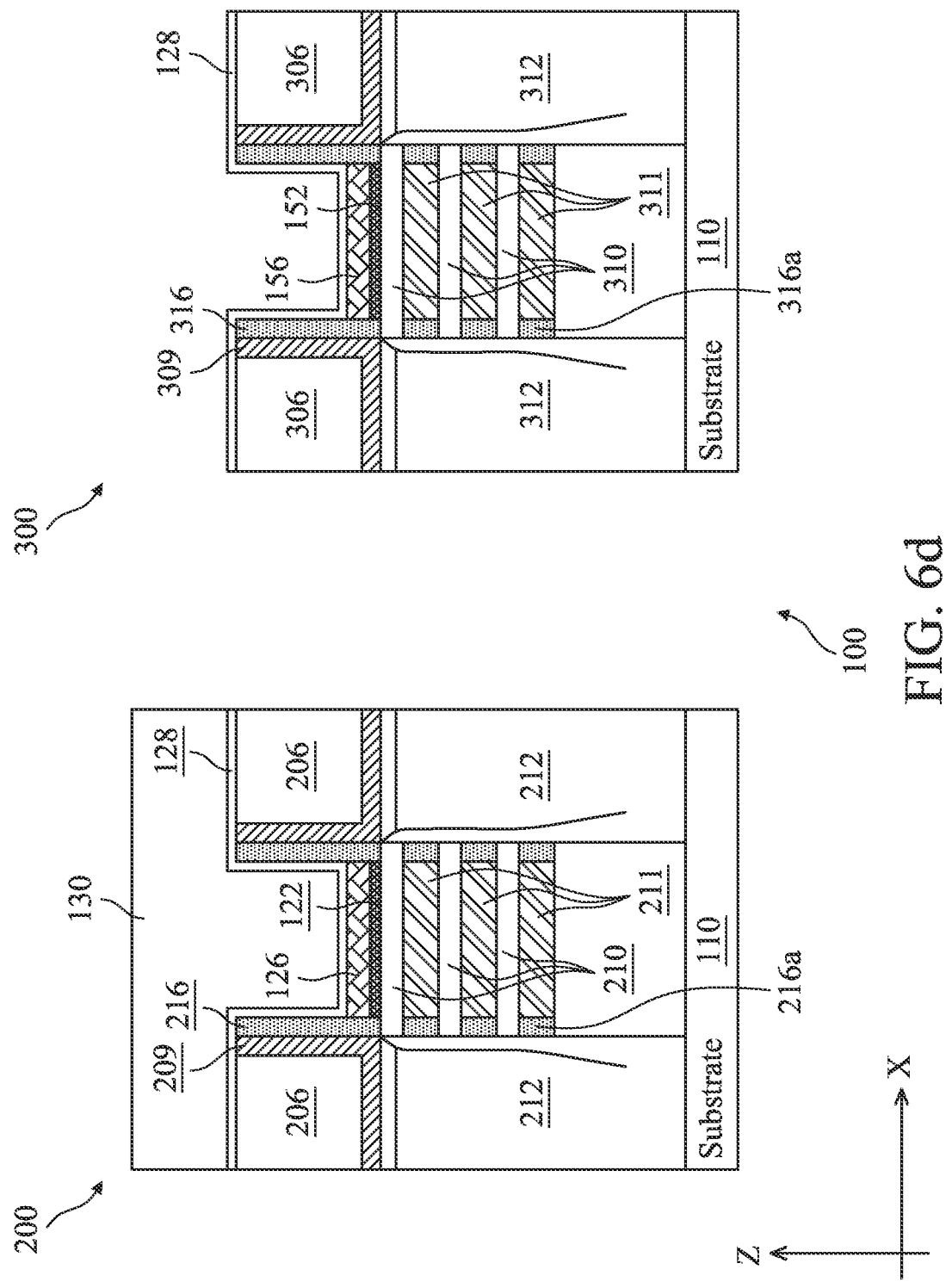

At operation 504, the method 500 (FIG. 5a) partially recesses the sacrificial gate layers 126 and 156, such as shown in FIG. 6b. In an embodiment, the operation 504 uses a dry etching process that is selectively tuned to etch the sacrificial gate layers 126 and 156 while having little or no etching of other exposed layers (e.g., the layers 206, 209, 216, 306, 309, and 316) in the structures 200 and 300. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In an embodiment, the operation 504 uses a timer to control the depth of etching so that each of the sacrificial gate layers 126 and 156 is only partially removed. For example, each of the sacrificial gate layers 126 and 156 may be etched until it is only about a few nanometers thick from their initial height of, e.g., 10 nm to 50 nm. As shown in FIGS. 6f and 6g, the remaining portion of the sacrificial gate layer 126 is used as an etching mask when the semiconductor layers 311 are removed. Thus, the operation 504 is designed to keep a portion of the sacrificial gate layer 126 sufficiently thick for that purpose. Also, the sacrificial gate layer 126 may be partially etched when removing the sacrificial dielectric layer 152 (see FIGS. 6e, and 6f). The operation 504 is designed to take that into account as well.

At operation 506, the method 500 (FIG. 5a) forms a first patterned mask covering the structure 200 but exposing the structure 300. This may involve multiple processes. An embodiment of the operation 506 is shown in FIG. 5c.

Referring to FIG. 5c, the operation 506 includes steps (or sub-operations) 562, 564, 566, 568, and 570. The step 562 forms a hard mask layer 128 over both the structures 200 and 300, such as shown in FIG. 6c. In an embodiment, the hard mask layer 128 includes an oxide such as silicon dioxide. In another embodiment, the hard mask layer 128 includes a dielectric material that is the same as or substantially similar to the sacrificial dielectric layer 152 in composition. For example, the hard mask layer 128 may include a dielectric material, such as silicon dioxide, a high-k dielectric material, other suitable dielectric material, or combinations thereof. The hard mask layer 128 is deposited using CVD, ALD, or other suitable methods, and may have substantially uniform thickness.

The step 564 forms a photoresist layer 130 over the top surface of the IC 100 (i.e., over the structures 200 and 300), for example, by spin coating. The step 566 patterns the photoresist layer 130 using a photolithography process. For example, the photolithography process may include exposing the photoresist layer to radiation, developing the exposed photoresist layer, and removing certain areas of the photoresist layer to form a patterned photoresist 130 (FIG. 6d). The patterned photoresist 130 covers the structure 200 and exposes the structure 300. In some embodiment, the step 564 may deposit an anti-reflecting coating layer over the hard mask layer 128, then form the photoresist layer over the anti-reflecting coating layer. In those embodiments, the patterned mask 130 refers to both the patterned photoresist and the patterned anti-reflecting coating layer.

Figure 6E:
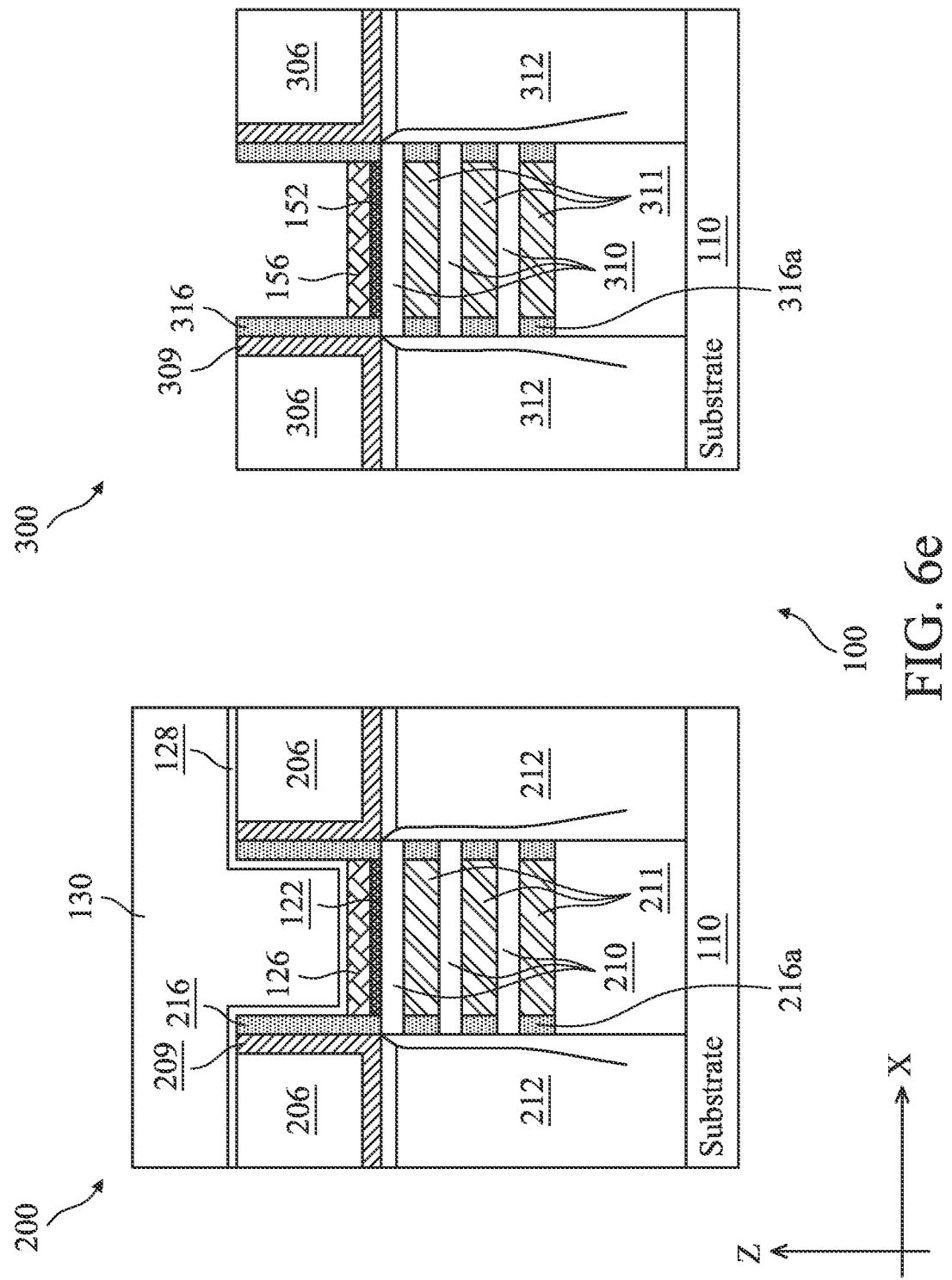
Figure 6F:
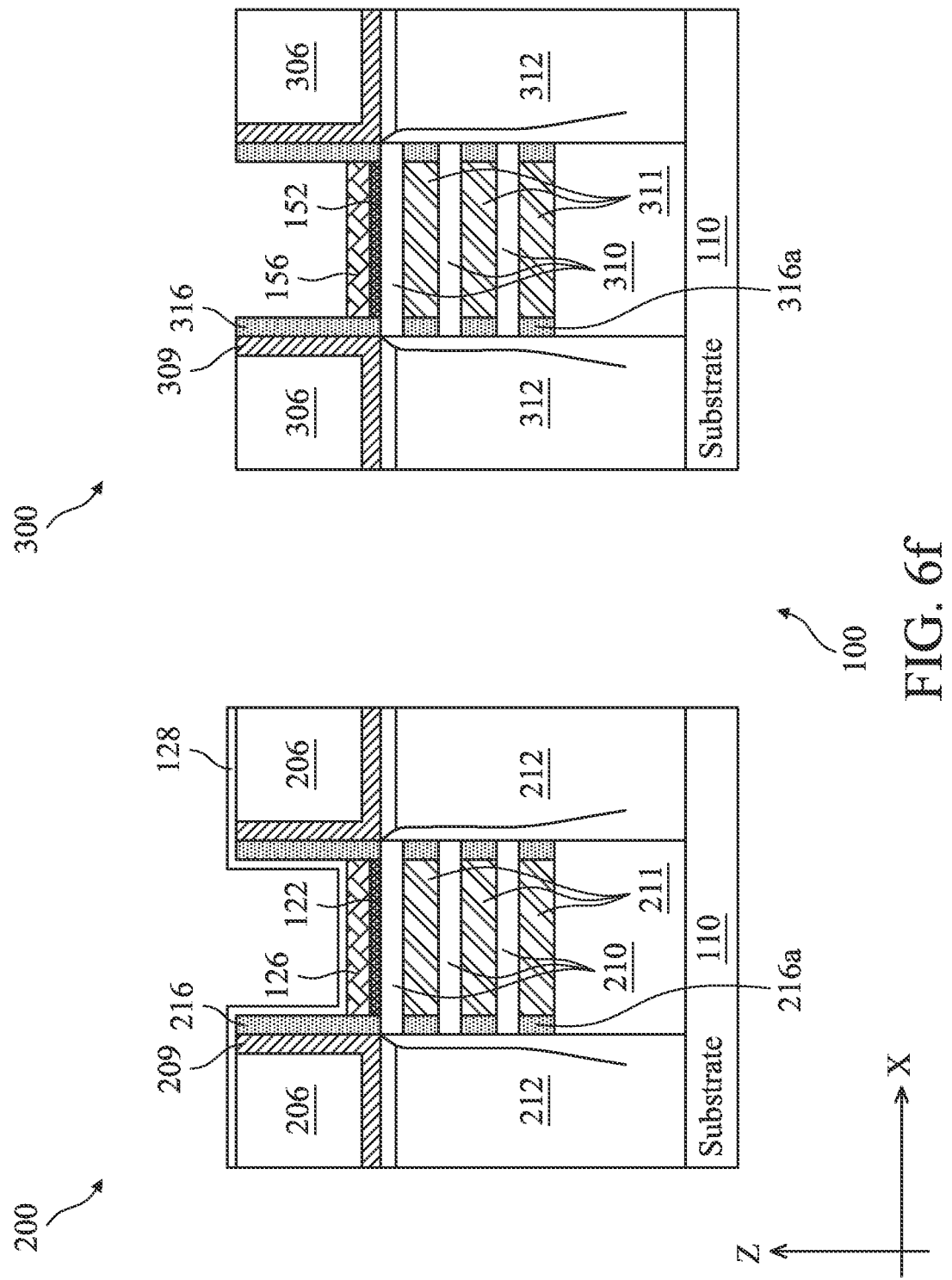
Figure 6G:
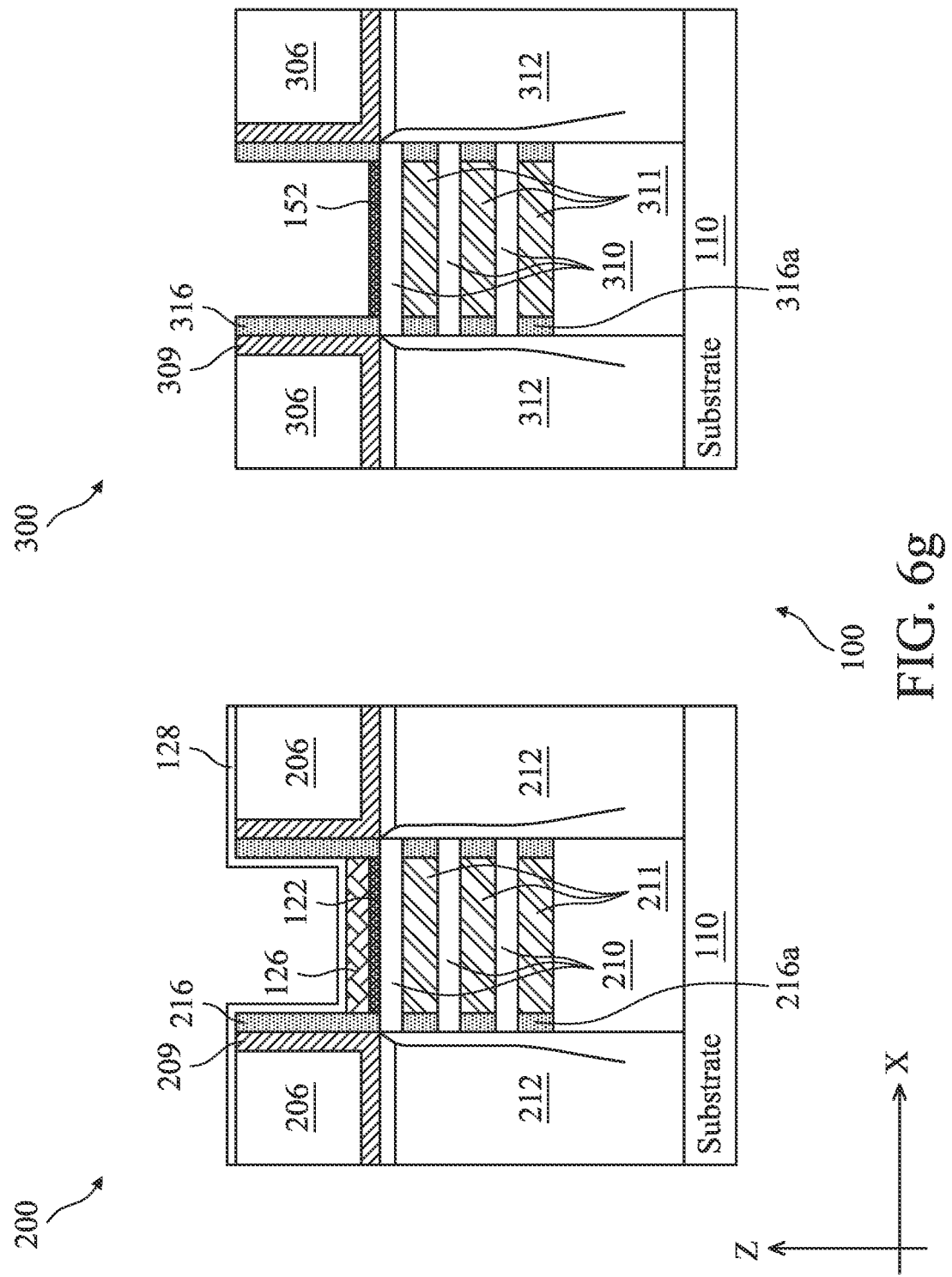

The step 568 etches the hard mask layer 128 (e.g., using dry etching) using the patterned mask 130 as an etching mask, thereby removing the hard mask layer 128 from the top of the structure 300, such as shown in FIG. 6e. The step 570 removes the patterned mask 130, for example, by ashing, stripping, or other suitable methods. The resulting structure 100 is shown in FIG. 6f. Referring to FIG. 6f, at the end of the operation 506, the structure 200 is covered by the patterned hard mask layer 128, while the structure 300 is not covered by a mask. The sacrificial gate layer 156 is exposed.

At operation 508, the method 500 (FIG. 5a) removes the sacrificial gate layer 156 from the structure 300, while the structure 200 is covered by the patterned hard mask layer 128. In an embodiment, the operation 508 applies a wet etching to remove the sacrificial gate layer 156. The wet etching is tuned to selectively remove the sacrificial gate layer 156 but not the layers 128, 152, 316, 309, and 306. For example, the wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The operation 508 may use other suitable etching method to selectively remove the sacrificial gate layer 156. After the sacrificial gate layer 156 is removed from the structure 300, the structure is shown in FIG. 6g.

Figure 6H:
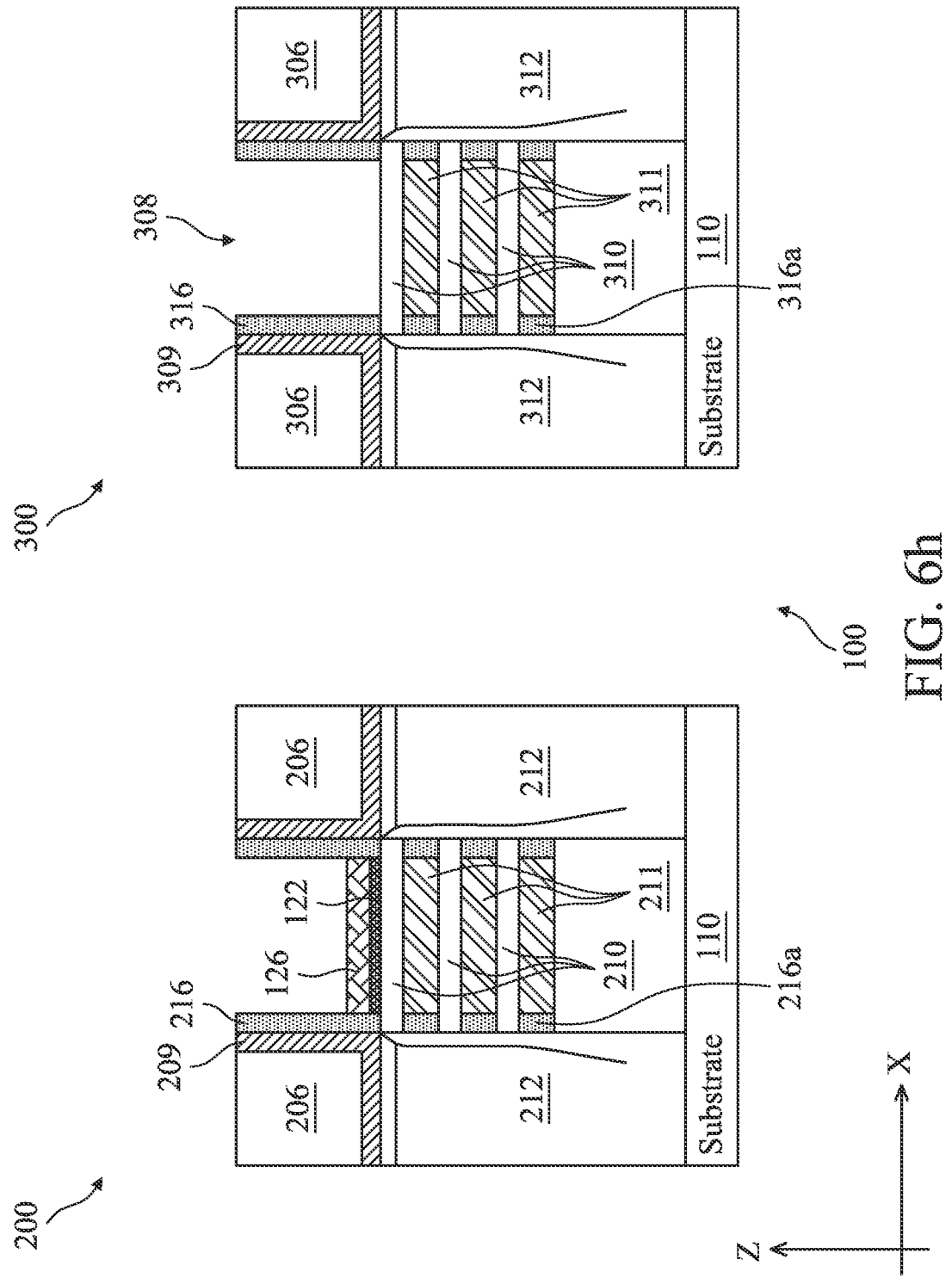

At operation 510, the method 500 (FIG. 5a) removes the sacrificial dielectric layer 152 from the structure 300 and removes the hard mask layer 128 from the structure 200 simultaneously. In an embodiment, the hard mask layer 128 and the sacrificial dielectric layer 152 are designed to have the same or substantially similar material to simplify the operation 510. For example, the operation 510 may use a dry etching process that is selectively tuned to etch both the hard mask layer 128 and the sacrificial dielectric layer 152 while having little or no etching of other layers (e.g., the layers 126, 216, 209, 206, 310, 306, 309, and 316) in the structures 200 and 300. The resulting structure 100 is shown in FIG. 6h. In the structure 200, the sacrificial dielectric layer 122 and a portion of the sacrificial gate layer 126 are still disposed above the channel region 210. In the structure 300, the semiconductor layers 310 and 311 are exposed in a trench 308 resulted from the removal of the sacrificial gate stack 150.

Figure 6I:
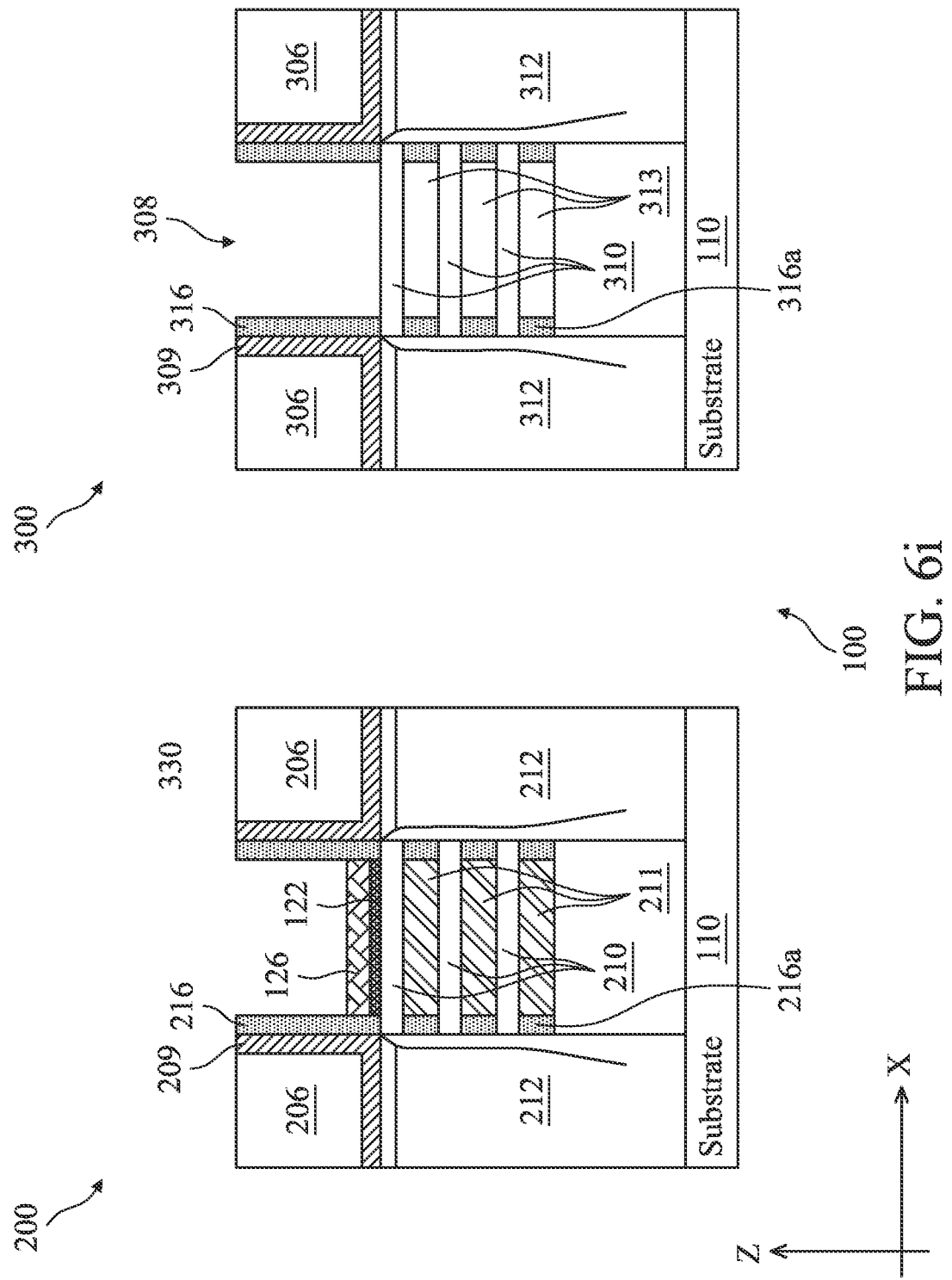

At operation 512, the method 500 (FIG. 5a) selectively removes the semiconductor layers 311 from the structure 300, thereby forming suspended semiconductor layers 310 with space 313 between vertically adjacent semiconductor layers 310, as shown in FIG. 6i. This is also referred to as a channel nanowire release process. For example, the operation 512 applies an etching process that selectively etches semiconductor layers 311 with minimal (to no) etching of semiconductor layers 310 and, in some embodiments, minimal (to no) etching of gate spacers 216/316, inner spacers 316a, and the sacrificial gate layer 126. Various etching parameters can be tuned to achieve selective etching of semiconductor layers 311, such as etchant composition, etching temperature, etching solution concentration, etching time, etching pressure, source power, RF bias voltage, RF bias power, etchant flow rate, other suitable etching parameters, or combinations thereof. The etching process can be a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 311. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 311. In some embodiments, a chemical vapor phase etching process using hydrochloric acid (HCl) selectively etches semiconductor layers 311.

Figure 6J:
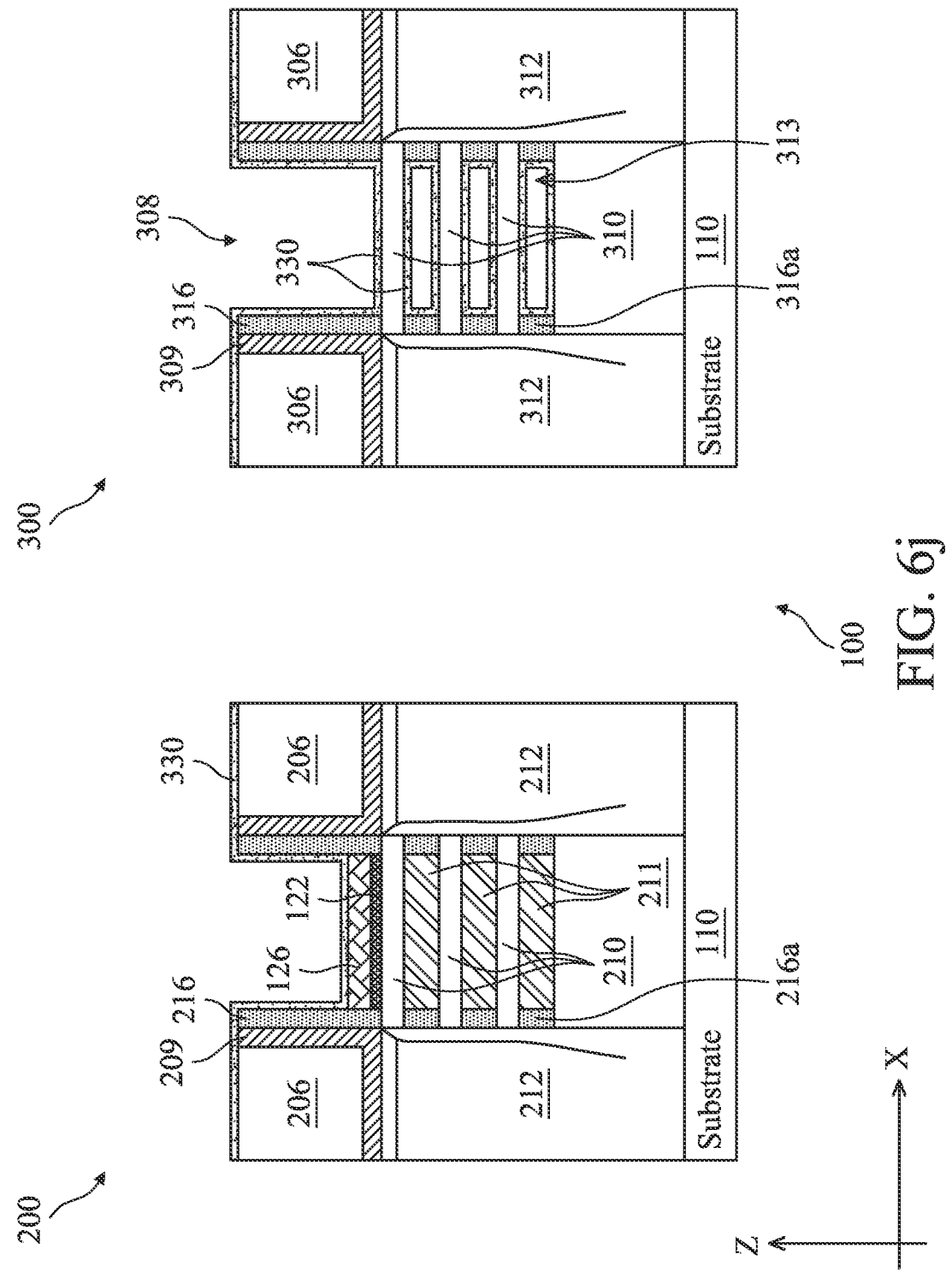

At operation 514, the method 500 (FIG. 5b) deposits a DCM layer 330 over both the structures 200 and 300. As shown in FIG. 6j, the DCM layer 330 is deposited to have a substantially uniform thickness in the present embodiment, such as about 1 nm to about 5 nm thick. Particularly, the thickness of the DCM layer 330 is less than half of the space 313 so that there is remaining space 313 vertically between the DCM layer 330. In some embodiments, the DCM layer 330 may be deposited to have a thickness greater than or equal to half of the space 313 so that the space 313 is fully filled with the DCM layer 330, resulting in a structure like the device 400 (FIGS. 4a-4d). Suitable materials for the DCM layer 330 have been described previously with reference to FIGS. 3a and 3b. For example, the DCM layer 330 may be a layer of amorphous silicon doped with p-type dopant(s) (e.g., boron) or n-type dopant(s) (e.g., phosphorous, arsenic). Particularly, the layer of amorphous silicon may be doped with the same type of dopants as in the S/D electrodes 312. The DCM layer 330 is deposited using ALD, PVD, CVD, or any suitable deposition methods.

At operation 516, the method 500 (FIG. 5b) forms a second patterned mask covering the structure 300 but exposing the structure 200. This may involve multiple processes. An embodiment of the operation 516 is shown in FIG. 5d. Referring to FIG. 5d, the operation 516 includes steps (or sub-operations) 582, 584, 586, 588, and 590, which are similar to the steps 562, 564, 566, 568, and 570 respectively.

Figure 6K:
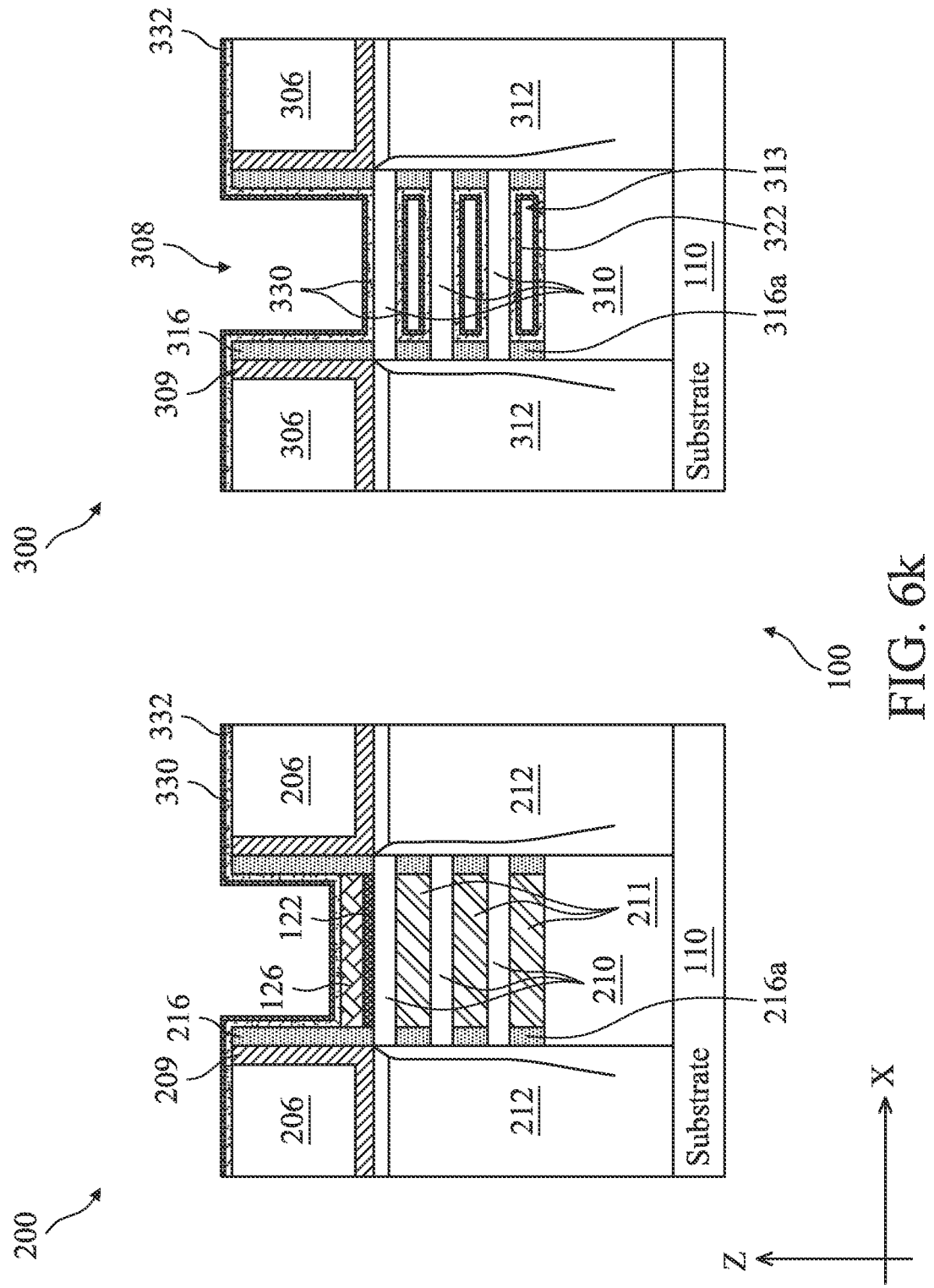
Figure 6I:
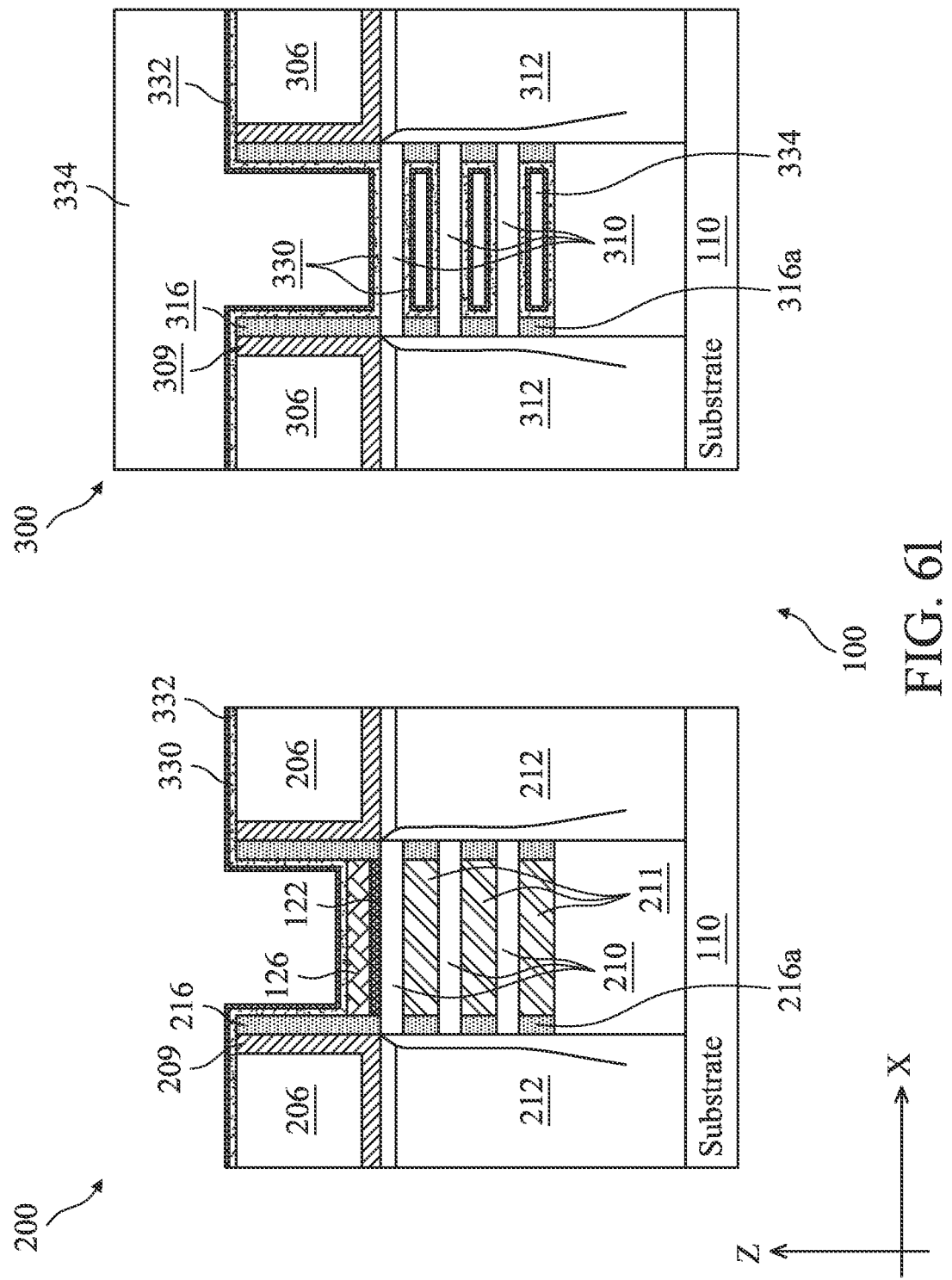

The step 582 forms a hard mask layer 332 over both the structures 200 and 300, such as shown in FIG. 6k. The hard mask layer 332 may include an oxide such as silicon dioxide or a dielectric material that is the same as or substantially similar to the sacrificial dielectric layer 122 in composition. The hard mask layer 332 may be deposited using CVD, ALD, or other suitable methods, and may have a substantially uniform thickness. In an embodiment where the DCM layer 330 is a layer of amorphous silicon, silicon, or silicon germanium, the DCM layer 330 may be partially oxidized (e.g., using a wet cleaning process containing oxygen) to form the hard mask layer 332 to include silicon dioxide or silicon germanium oxide.

The step 584 forms a photoresist layer 334 over the top surface of the IC 100 (i.e., over the structures 200 and 300), for example, by spin coating. The step 586 patterns the photoresist layer using a photolithography process to form a patterned photoresist 334 (FIG. 6l). The patterned photoresist 334 covers the structure 300 and exposes the structure 200. In some embodiment, the step 584 may deposit an anti-reflecting coating layer over the hard mask layer 332, then form the photoresist layer over the anti-reflecting coating layer. In those embodiments, the patterned mask 334 refers to both the patterned photoresist and the patterned anti-reflecting coating layer.

Figure 6M:
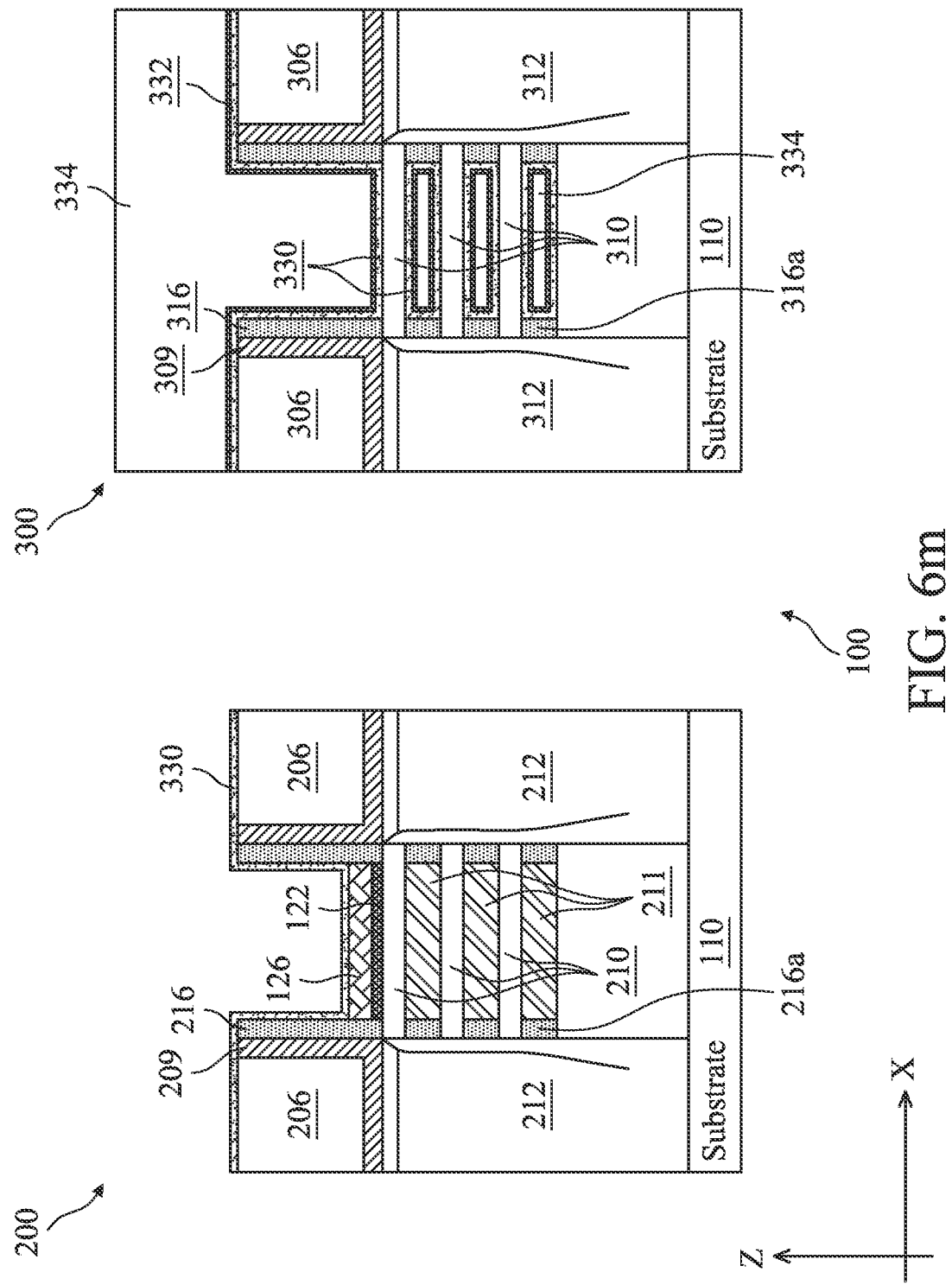
Figure 6N:
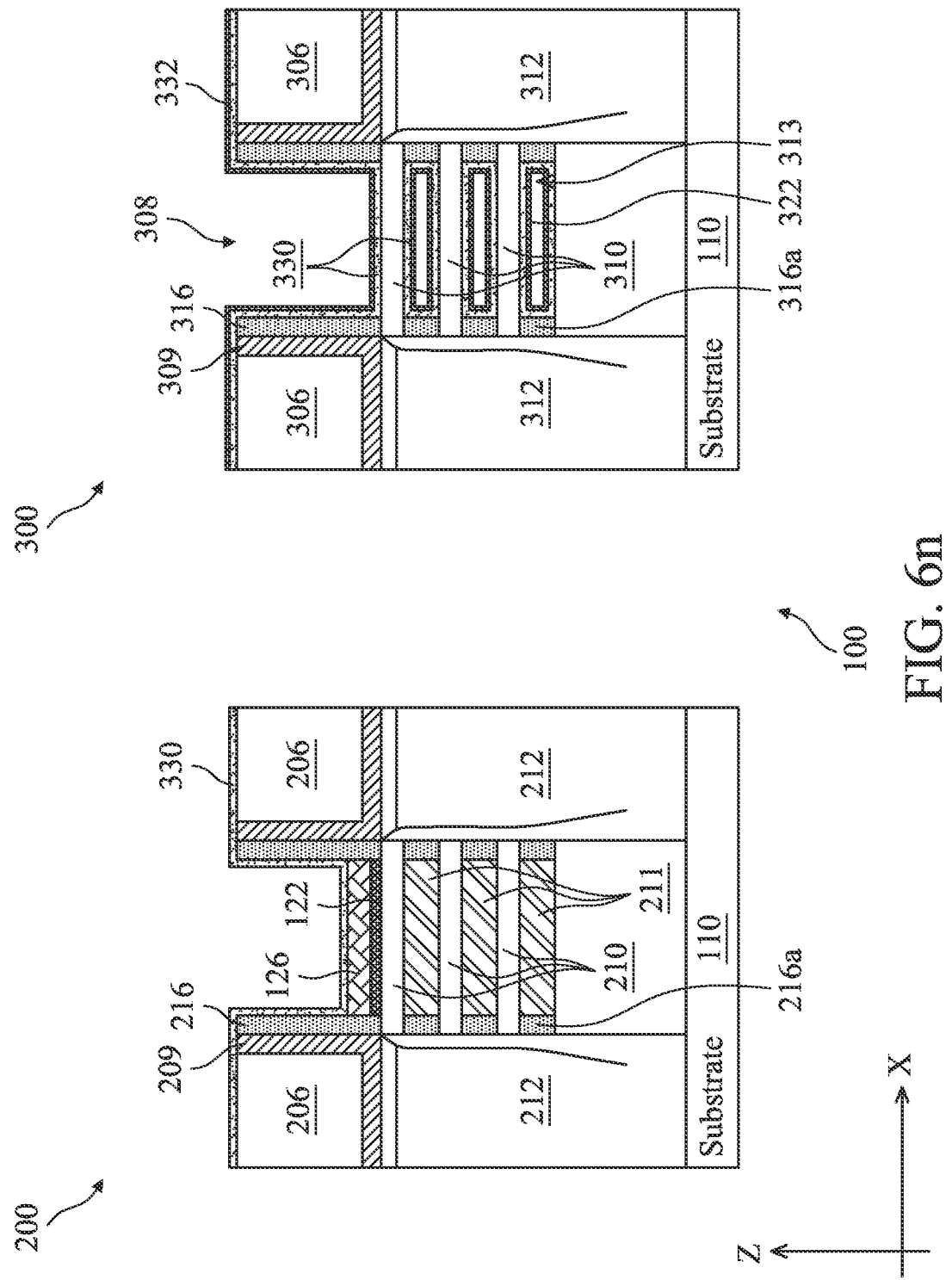

The step 588 etches the hard mask layer 332 (e.g., using dry etching) using the patterned mask 334 as an etching mask, thereby removing the hard mask layer 332 from the top of the structure 200, such as shown in FIG. 6m. The step 590 removes the patterned mask 334, for example, by ashing, stripping, or other suitable methods. The resulting structure 100 is shown in FIG. 6n. Referring to FIG. 6n, at the end of the operation 516, the structure 300 is covered by the patterned hard mask layer 332, while the structure 200 is not covered by a mask. The DCM layer 330 over the structure 200 is exposed.

Figure 6O:
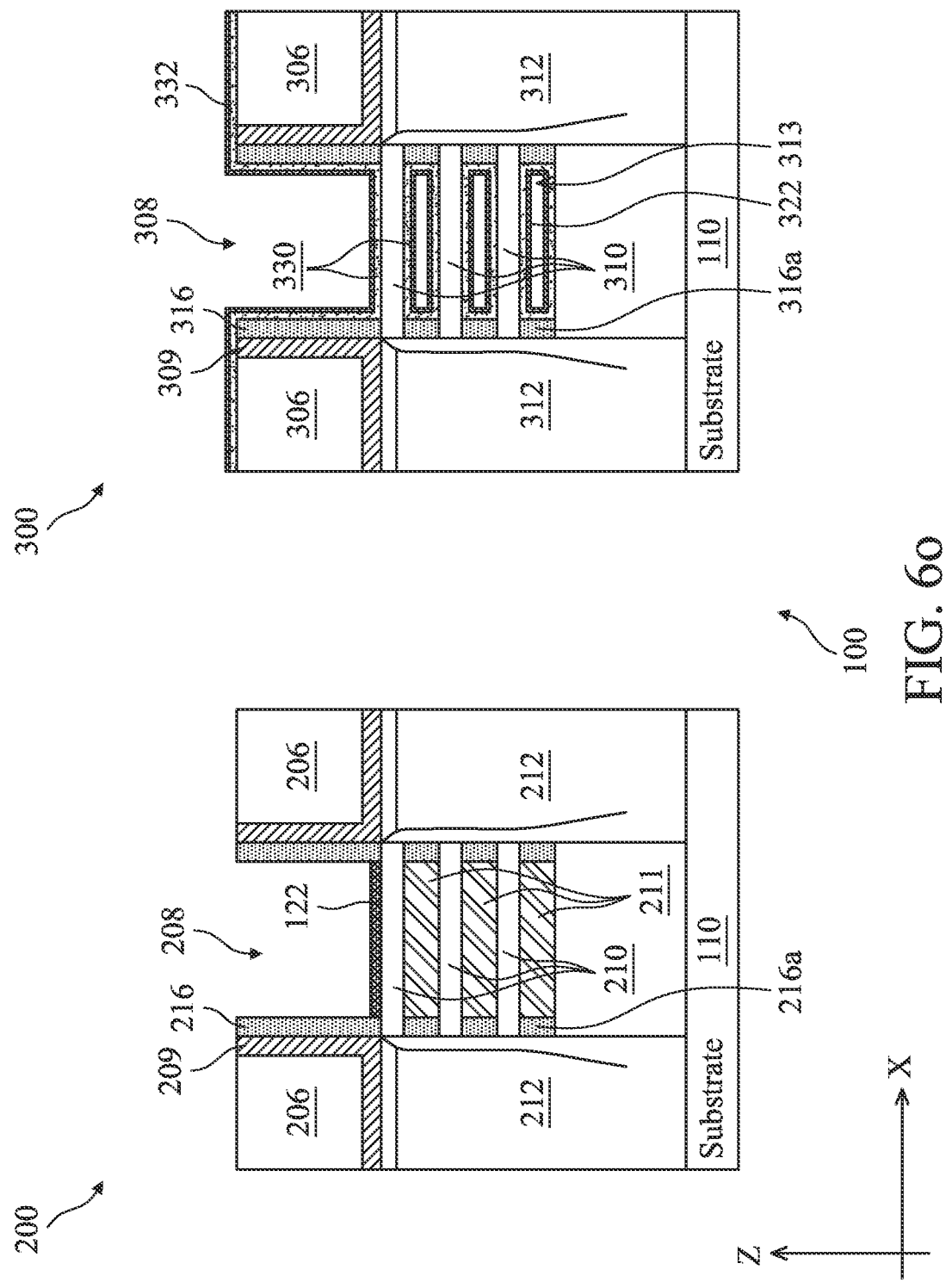

At operation 518, the method 500 (FIG. 5b) removes the DCM layer 330 and the sacrificial gate layer 126 from the structure 200. In an embodiment, the operation 518 applies a wet etching to remove the DCM layer 330 and the sacrificial gate layer 126. The wet etching is tuned to selectively remove the DCM layer 330 and the sacrificial gate layer 126 from the structure 200 but has little or no etching to the layers 332, 122, 216, 209, and 206. For example, the wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The operation 518 may use other suitable etching method to selectively remove the DCM layer 330 and the sacrificial gate layer 126 from the structure 200. The resulting structure is shown in FIG. 6o. In the structure 200, the sacrificial dielectric layer 122 is exposed in a trench 208 resulted from the removal of the sacrificial gate layer 126. In the structure 300, the hard mask layer 332 covers various surfaces of the structure 300.

At operation 520, the method 500 (FIG. 5b) removes the sacrificial dielectric layer 122 from the structure 200 and the hard mask layer 332 from the structure 300. In an embodiment, the operation 520 removes the sacrificial dielectric layer 122 and the hard mask layer 332 simultaneously by the same process. For example, the operation 520 may remove the layers 122 and 332 by a dry etching process that is tuned to selectively remove the materials of the layers 122 and 332 with little or no etching to the layers 330, 210, 216, 208, and 206. When the layers 122 and 332 contain the same or substantially similar materials, the operation 520 is particularly effective and simplifies the overall process. Alternatively, the operation 520 may remove the sacrificial dielectric layer 122 and the hard mask layer 332 by two different processes. After the operation 520 finishes, the resultant structure 100 is shown in FIG. 6p. In the structure 200, the semiconductor layers 210 and 211 are exposed in the trench 208 resulted from the removal of the sacrificial gate stack 120. In the structure 300, the DCM layer 330 covers various surfaces of the structure 300.

Figure 6Q:
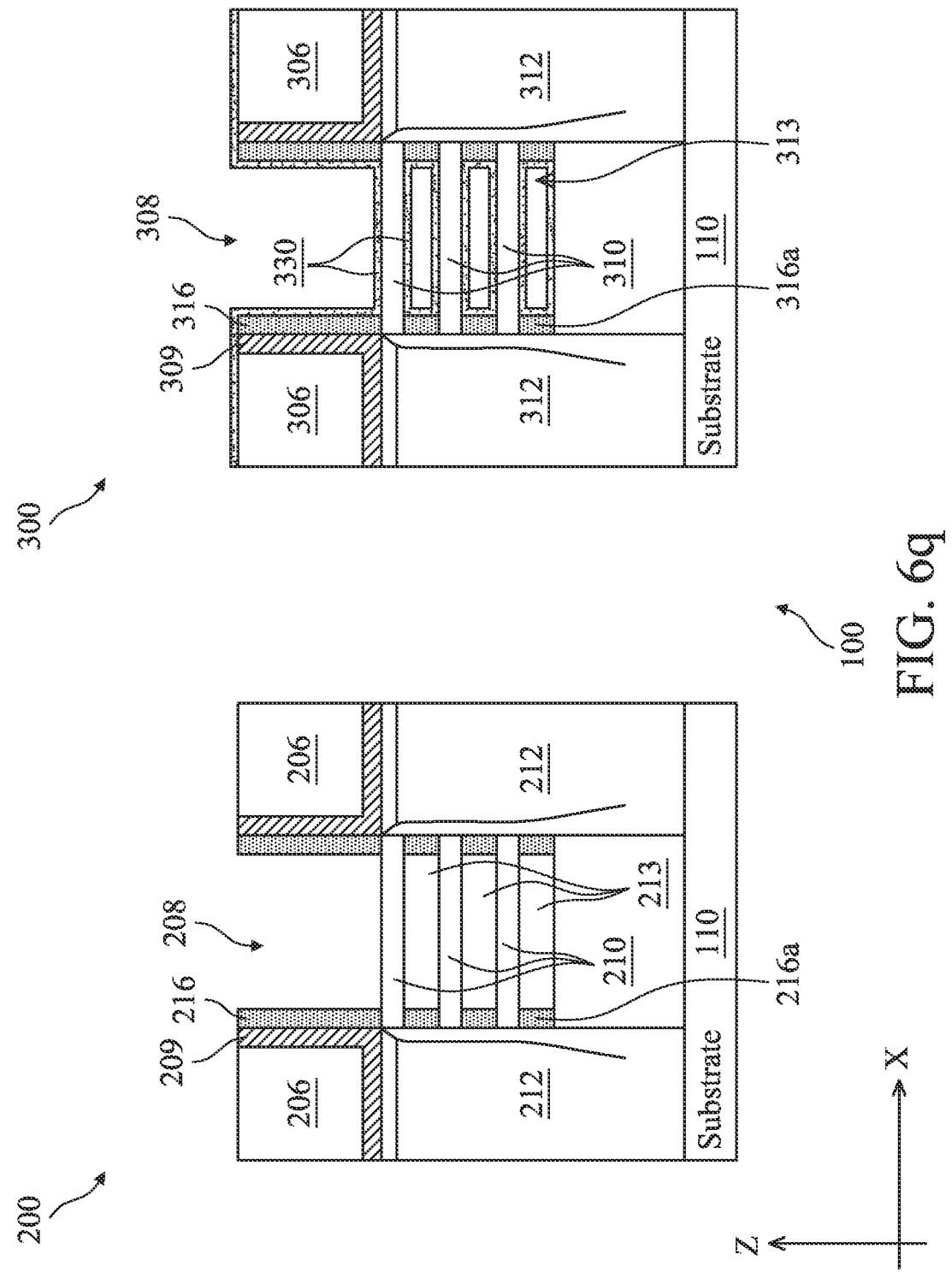

At operation 522, the method 500 (FIG. 5b) selectively removes the semiconductor layers 211 from the structure 200, thereby forming suspended semiconductor layers 210 with space 213 between vertically adjacent semiconductor layers 310. This is a channel nanowire release process similar to the operation 512 performed to the structure 300. For example, the operation 522 applies an etching process that selectively etches semiconductor layers 211 with minimal (to no) etching of semiconductor layers 210 and, in some embodiments, minimal (to no) etching of gate spacers 216, inner spacers 216a, and the DCM layer 330. The etching process can be a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 211. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 211. In some embodiments, a chemical vapor phase etching process using hydrochloric acid (HCl) selectively etches semiconductor layers 211. After the operation 522 finishes, the resultant structure 100 is shown in FIG. 6q. In the structure 200, the semiconductor layers 210 are exposed and suspended in the trench 208. In the structure 300, the DCM layer 330 covers the various surfaces of the structure 300.

Figure 6R:
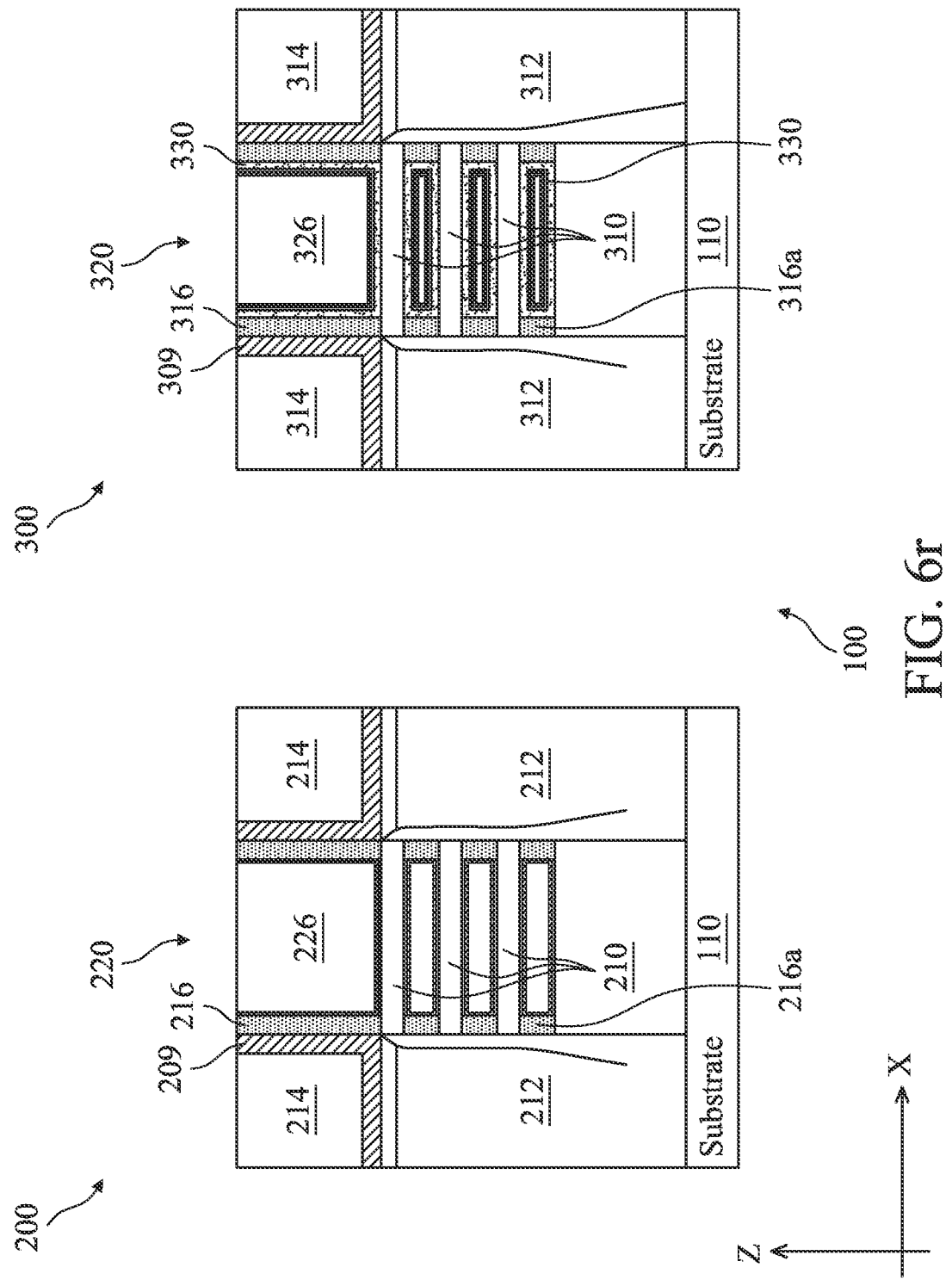

At operation 524, the method 500 (FIG. 5b) forms a gate dielectric layer and a gate electrode layer over both the structures 200 and 300 in the trenches 208 and 308 respectively. Particularly, the operation 524 forms the gate stack 220 over the channel regions 210 in the structure 200 and forms the gate stack 320 over the DCM layer 330 in the structure 300 (FIG. 6r). The various layers of the gate stacks 220 and 320 have been described previously with reference to FIGS. 2a-2b and FIGS. 3a-3b.

At operation 526, the method 500 (FIG. 5b) performs further steps to the IC 100 including forming the S/D contacts 214 and 314 (FIG. 6r) and forming multi-layer interconnects over the structures 200 and 300. Particularly, the S/D contacts 314 may be electrically connected by the multi-layer interconnects to make the structure 300 a capacitor. In some embodiment, the method 500 may be used for making capacitors on a FinFET structure, for example, by omitting the operations 512 and 522. Such embodiments may produce capacitors according to the structure 400a (FIGS. 4e and 4f).

Figure 7A:
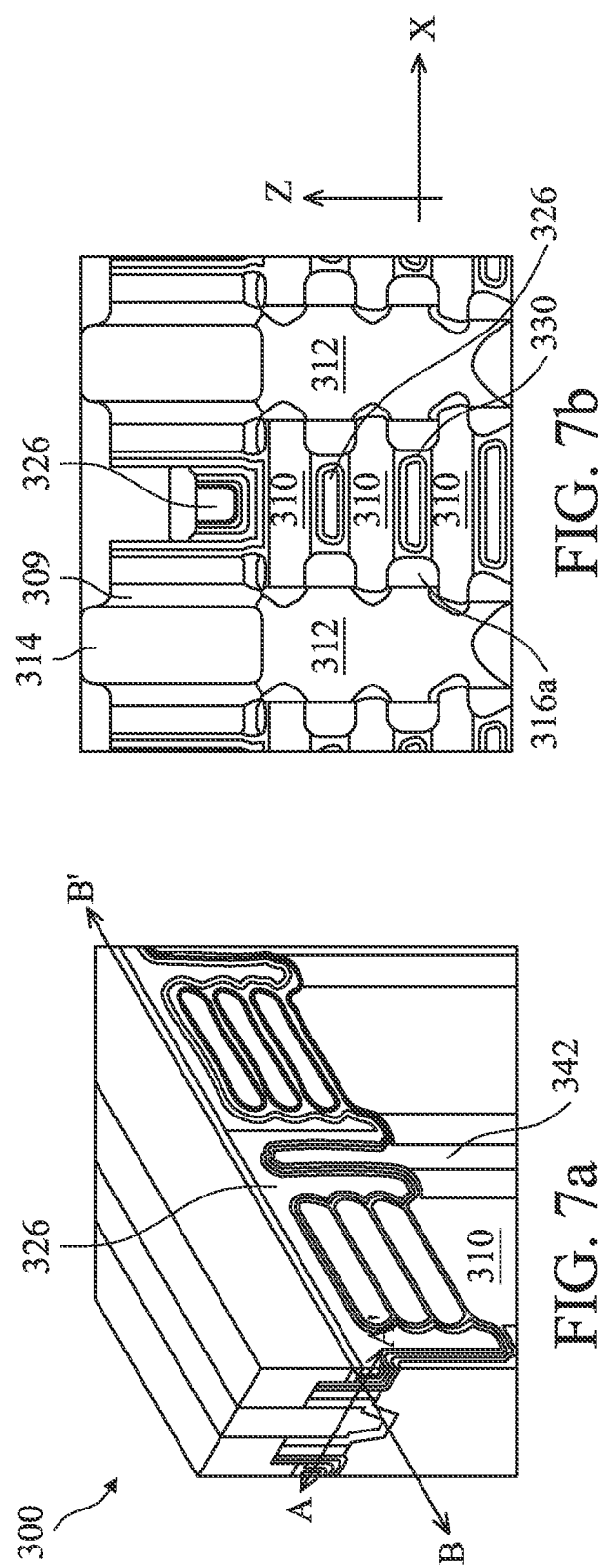
FIGS. 7a, 7b, and 7c illustrate perspective and cross-sectional views of a semiconductor device, according to various aspects of the present disclosure.
Figure 7B:
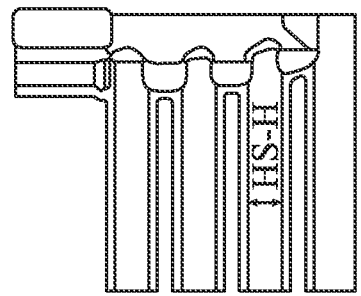
Figure 7C:
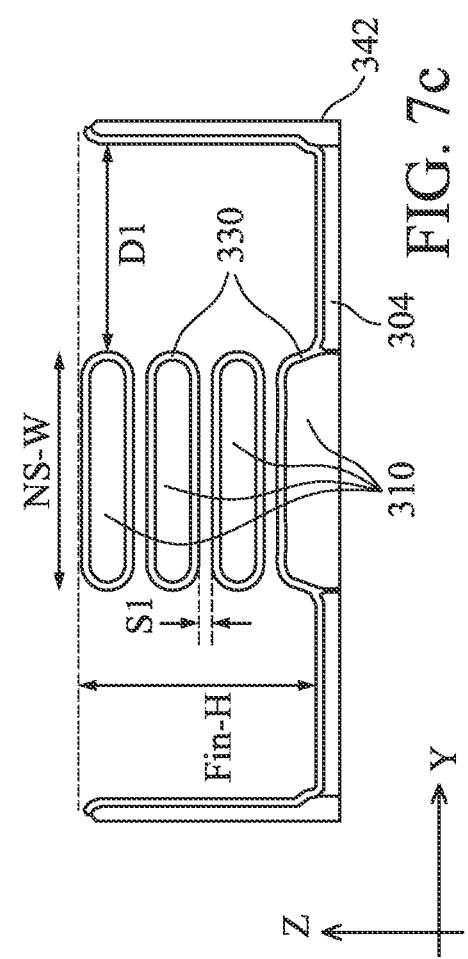

FIG. 7a illustrates a perspective view of the structure 300 in an embodiment. FIGS. 7b and 7c illustrate partial, cross-sectional views of the structure 300 along the A-A' and B-B' lines of FIG. 7a respectively. The various layers of the structure 300 have been described above with reference to FIGS. 3a-3b. FIGS. 7a and 7c further illustrate that adjacent structures (e.g., two structures 300, or a structure 200 and a structure 300) are separated by a dummy fin 342 in the present embodiment. The dummy fin 342 may include a dielectric material such as silicon dioxide, silicon nitride, or other suitable dielectric material. The DCM layer 330 is deposited not only around (and surrounding the semiconductor layers 310), but also on sidewalls of the dummy fin 342 and on the top surface of the isolation structure 304. A distance D1 between the end of the semiconductor layer 310 and the dummy fin 342 is about 10 nm to about 100 nm along the Y direction. The semiconductor layers 310 may each have a thickness NS-H about 3 nm to about 15 nm along the Z direction and a width NS-W about 3 nm to 80 nm along the Y direction. A height of the dummy fin 342 above the isolation structure 304 (Fin-H) is about 20 nm to 60 nm. This is also the height of the stack of semiconductor layers 310 from the top surface of the isolation structure 304. The space Si between the DCM layer 330 on adjacent semiconductor layers 310 is about 0 nm to 20 nm. When the Si is 0 nm, the structure 300 becomes an embodiment of the structure 400 (FIGS. 4a-4d).

Although not intended to be limiting, one or more embodiments of the present disclosure provide many benefits to a semiconductor device and the formation thereof. For example, embodiments of the present disclosure provide a process for making a capacitor and a transistor (a gate-all-around transistor or a FinFET transistor) using a common process flow. The disclosed process flow can be readily integrated with existing manufacturing processes. The capacitor is formed with a layer of conductive, semiconductor, or 2D material (referred to as a DCM layer) all around a high-k metal gate stack. Compared with designs without this DCM layer, the capacitor of the present embodiment has greater capacitance per device foot print. The increased capacitance meets the need for capacitance in advanced process nodes.

In one exemplary aspect, the present disclosure is directed to a semiconductor device that comprises a substrate, two source/drain (S/D) regions over the substrate, a channel region between the two S/D regions and including a semiconductor material, a deposited capacitor material (DCM) layer over the channel region, a dielectric layer over the DCM layer, and a metallic gate electrode layer over the dielectric layer.

In an embodiment of the semiconductor device, the DCM layer includes a layer of doped amorphous silicon. In another embodiment of the semiconductor device, the DCM layer includes silicon, silicon germanium, a metal, a silicide, or a 2-dimensional material. In a further embodiment, the 2-dimensional material is graphene or $MoS_2$.

In an embodiment of the semiconductor device, the dielectric layer includes a layer of a high-k dielectric material over a layer of silicon oxide. In an embodiment of the semiconductor device, the DCM layer fully separates the dielectric layer from the channel region.

In another embodiment of the semiconductor device, the channel region includes a layer of the semiconductor material suspended between the two S/D regions and over the substrate, wherein the DCM layer wraps around a portion of the layer of the semiconductor material.

In yet another embodiment of the semiconductor device, the channel region includes two layers of the semiconductor material suspended between the two S/D regions and over the substrate, wherein the DCM layer fully fills space between the two layers of the semiconductor material in a cross-section perpendicular to the two layers of the semiconductor material.

In yet another embodiment of the semiconductor device, the channel region includes a fin of the semiconductor material, and the DCM layer covers a top surface and two sidewall surfaces of the fin above an isolation structure.

In another exemplary aspect, the present disclosure is directed to a semiconductor device. The semiconductor device includes a substrate, a first device over a first region of the substrate, and a second device over a second region of the substrate. The first device includes two first source/drain (S/D) regions, a first channel region of a semiconductor material between the two first S/D regions, a first dielectric layer directly on the first channel region, and a first gate electrode layer over the first dielectric layer. The second device includes two second S/D regions, a second channel region of the semiconductor material between the two second S/D regions, a deposited capacitor material (DCM) layer directly on the second channel region, a second dielectric layer directly on the DCM layer, and a second gate electrode layer over the second dielectric layer.

In an embodiment of the semiconductor device, each of the first and the second dielectric layers includes a layer of a high-k dielectric material over an interfacial layer. In another embodiment of the semiconductor device, the second channel region includes a layer of the semiconductor material suspended between the two second S/D regions and over the substrate, wherein the DCM layer wraps around a portion of the layer of the semiconductor material.

In another embodiment of the semiconductor device, the first channel region includes two first layers of the semiconductor material suspended between the two first S/D regions and over the substrate, and a portion of the first dielectric layer and a portion of the first gate electrode layer are disposed between the two first layers. The second channel region includes two second layers of the semiconductor material suspended between the two second S/D regions and over the substrate, and a portion of the DCM layer, a portion of the second dielectric layer, and a portion of the second gate electrode layer are disposed between the two second layers.

In yet another embodiment of the semiconductor device, the first channel region includes two first layers of the semiconductor material suspended between the two first S/D regions and over the substrate, and a portion of the first dielectric layer and a portion of the first gate electrode layer are disposed between the two first layers. Further, the second channel region includes two second layers of the semiconductor material suspended between the two second S/D regions and over the substrate, and a portion of the DCM layer fully fills space between the two second layers in a cross-section perpendicular to the two second layers.

In yet another exemplary aspect, the present disclosure is directed to a method. The method includes providing first and second structures over a substrate. Each of the first and the second structures includes two source/drain (S/D) regions, a channel region between the two S/D regions, a sacrificial dielectric layer over the channel region, a sacrificial gate over the sacrificial dielectric layer, a gate spacer on sidewalls of the sacrificial gate, and an interlayer dielectric (ILD) layer over the two S/D regions and over the sidewalls of the gate spacer. The method further includes partially recessing the sacrificial gate without exposing the sacrificial dielectric layer in each of the first and the second structures; forming a first patterned mask that covers the first structure and exposes the second structure; removing the sacrificial gate from the second structure while the first structure is covered by at least a portion of the first patterned mask; removing the first patterned mask and the sacrificial dielectric layer from the second structure while the sacrificial dielectric layer in the first structure is covered by at least a portion of the sacrificial gate; and depositing a layer of a capacitor material over the portion of the sacrificial gate in the first structure and over the channel region in the second structure.

In an embodiment of the method, the forming of the first patterned mask includes forming a hard mask layer over each of the first and the second structures; forming a photoresist layer over the hard mask layer; patterning the photoresist layer to result in a patterned photoresist covering the hard mask layer over the first structure and exposing the hard mask layer over the second structure; removing the hard mask layer from the second structure while the patterned photoresist is disposed over the first structure; and removing the patterned photoresist.

In another embodiment where the channel region of the second structure includes two layers of different semiconductor materials, the method further includes removing one of the two layers from the channel region of the second structure after the removing of the sacrificial dielectric layer from the second structure and before the depositing of the layer of the capacitor material.

In an embodiment, the method further includes forming a second patterned mask that covers the layer of the capacitor material in the second structure and exposes the layer of the capacitor material in the first structure; removing the layer of the capacitor material and the sacrificial gate from the first structure while the second structure is covered by at least a portion of the second patterned mask; removing the second patterned mask from the second structure; removing the sacrificial dielectric layer from the first structure; forming a gate dielectric layer over the channel region in the first structure and over the layer of the capacitor material in the second structure; and forming a gate electrode layer over the gate dielectric layer in the first and the second structures.

In a further embodiment, the forming of the second patterned mask includes forming a hard mask layer over each of the first and the second structures; forming a photoresist layer over the hard mask layer; patterning the photoresist layer to result in a patterned photoresist covering the hard mask layer over the second structure and exposing the hard mask layer over the first structure; removing the hard mask layer from the first structure while the patterned photoresist is disposed over the second structure; and removing the patterned photoresist.

In an embodiment where the channel region of the first structure includes two layers of different semiconductor materials, the method further includes removing one of the two layers from the channel region of the first structure after the removing of the sacrificial dielectric layer from the first structure and before the forming of the gate dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing first and second structures over a substrate, wherein the first structure includes first source and drain regions, a first channel region between the first source and drain regions, a first sacrificial dielectric layer over the first channel region, and a first sacrificial gate over the first sacrificial dielectric layer, wherein the second structure includes second source and drain regions, a second channel region between the second source and drain regions, a second sacrificial dielectric layer over the second channel region, and a second sacrificial gate over the second sacrificial dielectric layer;
   partially recessing the first and the second sacrificial gates;
   forming a first patterned mask that covers the first structure and exposes the second structure;
   selectively removing the second sacrificial gate from the second structure while the first structure is covered by at least a portion of the first patterned mask;
   removing the first patterned mask and the second sacrificial dielectric layer while the first sacrificial dielectric layer is covered by at least a portion of the first sacrificial gate; and
   depositing a layer of a capacitor material over the first sacrificial gate and over the second channel region.

2. The method of claim 1, wherein the capacitor material includes silicon, silicon germanium, a metal, a silicide, or a 2-dimensional material.

3. The method of claim 2, wherein the 2-dimensional material includes graphene or MoS2.

4. The method of claim 1, wherein the second channel region includes two layers of different semiconductor materials, further comprising:

after the removing of the second sacrificial dielectric layer and before the depositing of the layer of the capacitor material, removing one of the two layers of different semiconductor materials.

5. The method of claim 1, further comprising:
forming a second patterned mask that covers the second structure and exposes the layer of the capacitor material in the first structure;
removing the first sacrificial gate and the layer of the capacitor material over the first structure while the second structure is covered by at least a portion of the second patterned mask;
removing the second patterned mask and the first sacrificial dielectric layer; and
forming a gate dielectric layer over the first channel region and over the layer of the capacitor material in the second structure.

6. The method of claim 5, further comprising: forming a gate electrode layer over the gate dielectric layer in the first and the second structures.

7. The method of claim 5, wherein the first channel region includes two layers of different semiconductor materials, further comprising: after the removing of the first sacrificial dielectric layer and before the forming of the gate dielectric layer, removing one of the two layers of different semiconductor materials.

8. A method, comprising:
providing first and second structures over a substrate, wherein each of the first and the second structures includes source and drain regions, a channel region between the source and drain regions, a sacrificial dielectric layer over the channel region, and a sacrificial gate over the sacrificial dielectric layer;
partially recessing the sacrificial gate without exposing the sacrificial dielectric layer in each of the first and the second structures;
forming a first patterned mask over the sacrificial gate of the first structure and exposes the sacrificial gate of the second structure;
removing the sacrificial gate from the second structure while the sacrificial gate of the first structure is covered by at least a portion of the first patterned mask; and
removing the first patterned mask and the sacrificial dielectric layer from the second structure simultaneously.

9. The method of claim 8, wherein, after the first patterned mask is removed, the sacrificial dielectric layer in the first structure is covered by at least a portion of the sacrificial gate in the first structure.

10. The method of claim 8, after the first patterned mask is removed, further comprising: depositing a layer of a capacitor material over the portion of the sacrificial gate in the first structure and over the channel region in the second structure.

11. The method of claim 10, wherein the capacitor material includes a metal, a silicide, graphene, or MoS2.

12. The method of claim 10, further comprising:
forming a second patterned mask that covers the layer of the capacitor material in the second structure and exposes the layer of the capacitor material in the first structure;
removing the layer of the capacitor material and the sacrificial gate from the first structure while the second structure is covered by at least a portion of the second patterned mask; and
removing the second patterned mask from the second structure and the sacrificial dielectric layer from the first structure simultaneously.

13. The method of claim 12, further comprising: forming a gate dielectric layer over the channel region in the first structure and over the layer of the capacitor material in the second structure; and forming a gate electrode layer over the gate dielectric layer in the first and the second structures.

14. The method of claim 8, wherein the channel region of the second structure includes two layers of different semiconductor materials, further comprising: after the removing of the sacrificial dielectric layer from the second structure, removing one of the two layers of different semiconductor materials.

15. A method, comprising:
providing first and second structures over a substrate, wherein each of the first and the second structures includes two source/drain (S/D) regions, a channel region between the two S/D regions, a sacrificial dielectric layer over the channel region, a sacrificial gate over the sacrificial dielectric layer, a gate spacer on sidewalls of the sacrificial gate, and an interlayer dielectric (ILD) layer over the two S/D regions and over the sidewalls of the gate spacer;
partially recessing the sacrificial gate without exposing the sacrificial dielectric layer in each of the first and the second structures;
forming a first patterned mask over the first structure and exposing the second structure;
removing the sacrificial gate from the second structure while the at least a portion of the first patterned mask is over the first structure;
removing the first patterned mask and the sacrificial dielectric layer from the second structure; and
after removing the first patterned mask, depositing a layer of a capacitor material over a portion of the sacrificial gate in the first structure and over the channel region in the second structure.

16. The method of claim 15, wherein the forming of the first patterned mask includes:
forming a hard mask layer over each of the first and the second structures;
forming a photoresist layer over the hard mask layer;
patterning the photoresist layer to result in a patterned photoresist covering the hard mask layer over the first structure and exposing the hard mask layer over the second structure;
removing the hard mask layer from the second structure while the patterned photoresist is disposed over the first structure; and
removing the patterned photoresist.

17. The method of claim 15, wherein the channel region of the second structure includes two layers of different semiconductor materials, further comprising:
after the removing of the sacrificial dielectric layer from the second structure and before the depositing of the layer of the capacitor material, removing one of the two layers of different semiconductor materials.

18. The method of claim 15, further comprising:
forming a second patterned mask that covers the layer of the capacitor material in the second structure and exposes the layer of the capacitor material in the first structure;
removing the layer of the capacitor material and the sacrificial gate from the first structure while the second structure is covered by at least a portion of the second patterned mask;

removing the second patterned mask from the second structure;

removing the sacrificial dielectric layer from the first structure;

forming a gate dielectric layer over the channel region in the first structure and over the layer of the capacitor material in the second structure; and forming a gate electrode layer over the gate dielectric layer in the first and the second structures.

19. The method of claim 18, wherein the forming of the second patterned mask includes:

forming a hard mask layer over each of the first and the second structures;

forming a photoresist layer over the hard mask layer;

patterning the photoresist layer to result in a patterned photoresist covering the hard mask layer over the second structure and exposing the hard mask layer over the first structure;

removing the hard mask layer from the first structure while the patterned photoresist is disposed over the second structure; and removing the patterned photoresist.

20. The method of claim 18, wherein the channel region of the first structure includes two other layers of different semiconductor materials, further comprising:

after the removing of the sacrificial dielectric layer from the first structure and before the forming of the gate dielectric layer, removing one of the two other layers of different semiconductor materials.

* * * * *